US012690261B2

(12) United States Patent
Chan et al.

(10) Patent No.: US 12,690,261 B2
(45) Date of Patent: Jul. 21, 2026

(54) INTEGRATED CIRCUIT CHIPS COMPRISING FORKSHEET DEVICES CONNECTED WITH BURIED POWER RAILS

(71) Applicant: IMEC VZW, Leuven (BE)

(72) Inventors: Boon Teik Chan, Wilsele (BE);
Gaspard Hiblot, Leuven (BE); Gioele Mirabelli, Leuven (BE)

(73) Assignee: Imec vzw, Leuven (BE)

( * ) Notice: Subject to any disclaimer, the term of this patent is extended or adjusted under 35 U.S.C. 154(b) by 399 days.

(21) Appl. No.: 18/529,121

(22) Filed: Dec. 5, 2023

(65) Prior Publication Data

US 2024/0290660 A1     Aug. 29, 2024

(30) Foreign Application Priority Data

Dec. 23, 2022     (EP) ..................................... 22216298

(51) Int. Cl.
*H10D 84/01*          (2026.01)
*H10D 84/03*          (2025.01)
*H10D 84/83*          (2025.01)
(52) U.S. Cl.
CPC ....... *H10D 84/038* (2025.01); *H10D 84/0149* (2025.01); *H10D 84/0151* (2025.01); *H10D 84/83* (2025.01)
(58) Field of Classification Search
CPC ............. H10D 84/0193; H10D 84/863; H10D 84/0149; H10D 84/038; H10D 62/121;
(Continued)

(56) References Cited

U.S. PATENT DOCUMENTS 11,437,283 B2      9/2022  Lilak et al.
2018/0374791 A1  12/2018  Smith et al.
(Continued)

FOREIGN PATENT DOCUMENTS

EP          3 840 054 A1      6/2021
EP          3 985 717 A2      4/2022
WO     2021/229740 A1     11/2021

OTHER PUBLICATIONS

Extended European Search Report dated Jun. 20, 2023, issued in European Patent Application No. 22216298.4, 8 pages.
(Continued)

*Primary Examiner* — Thanhha S Pham
(74) *Attorney, Agent, or Firm* — McDonnell Boehnen Hulbert & Berghoff LLP

(57)          ABSTRACT

Integrated circuit chips and method for making integrated circuit chips are provided. The method includes providing a semiconductor substrate, forming a device layer including a forksheet device on the substrate and providing the substrate with a substrate part of a dielectric wall of the forksheet device, a first shallow trench isolation and a second shallow trench isolation. The method also includes contacting a source or drain contact and extending into the substrate between the first shallow trench isolation and the dielectric wall, then removing the substrate material so as to expose an end of the dielectric wall, the first surface, and the second surface, then obtaining a first spacer and a second spacer, so as to obtain a trench, wherein the end of the dielectric wall is exposed to the trench, then depositing an electrically insulating material in the trench so as to form an extension.

13 Claims, 13 Drawing Sheets

(58) Field of Classification Search
CPC .......... H10W 20/069; H10W 20/0696; H10W
20/20; H10W 20/427; B82Y 10/00
See application file for complete search history.

(56) References Cited

U.S. PATENT DOCUMENTS

| | | |
|---|---|---|
| 2021/0376076 A1 | 12/2021 | Su et al. |
| 2021/0407999 A1 | 12/2021 | Huang et al. |
| 2022/0102520 A1 | 3/2022 | Shiliang et al. |

OTHER PUBLICATIONS

Disclosed Anonymously, "Buried Power Rails with Varying Height for Improved Power Connection," IP.com, IP.com No. IPCOM000267710D, pp. 1-6 (Nov. 16, 2021).
Kim, M. et al., "Novel Dual Liner Process for Side-Shielded Forksheet Device With Superior Design Margin," IEEE Transactions on Electron Devices, vol. 69(5), pp. 2232-2235 (2022).

51

210

220 a.  providing (901) a semiconductor substrate b.  forming (902) a device layer on the frontside surface of the semiconductor substrate, comprising a forksheet device comprising a dielectric wall c.  removing (903), from a backside surface of the semiconductor substrate, at least part of the semiconductor substrate material d.  obtaining (904) spacers so as to obtain a trench, wherein an end of the dielectric wall is exposed to the trench e.  depositing (905) an electrically insulating material in the trench thereby forming an extension to the dielectric wall f.  removing (906) the first spacer and the second spacer so as to form gaps g.  removing (907) via material from a via so as to expose a source or drain contact of a first transistor structure of the forksheet device h.  providing (908) an electrically conductive material in the via, and in the gaps to form buried power rails, wherein the via is electrically coupled to one of the buried power rails

FIG. 18

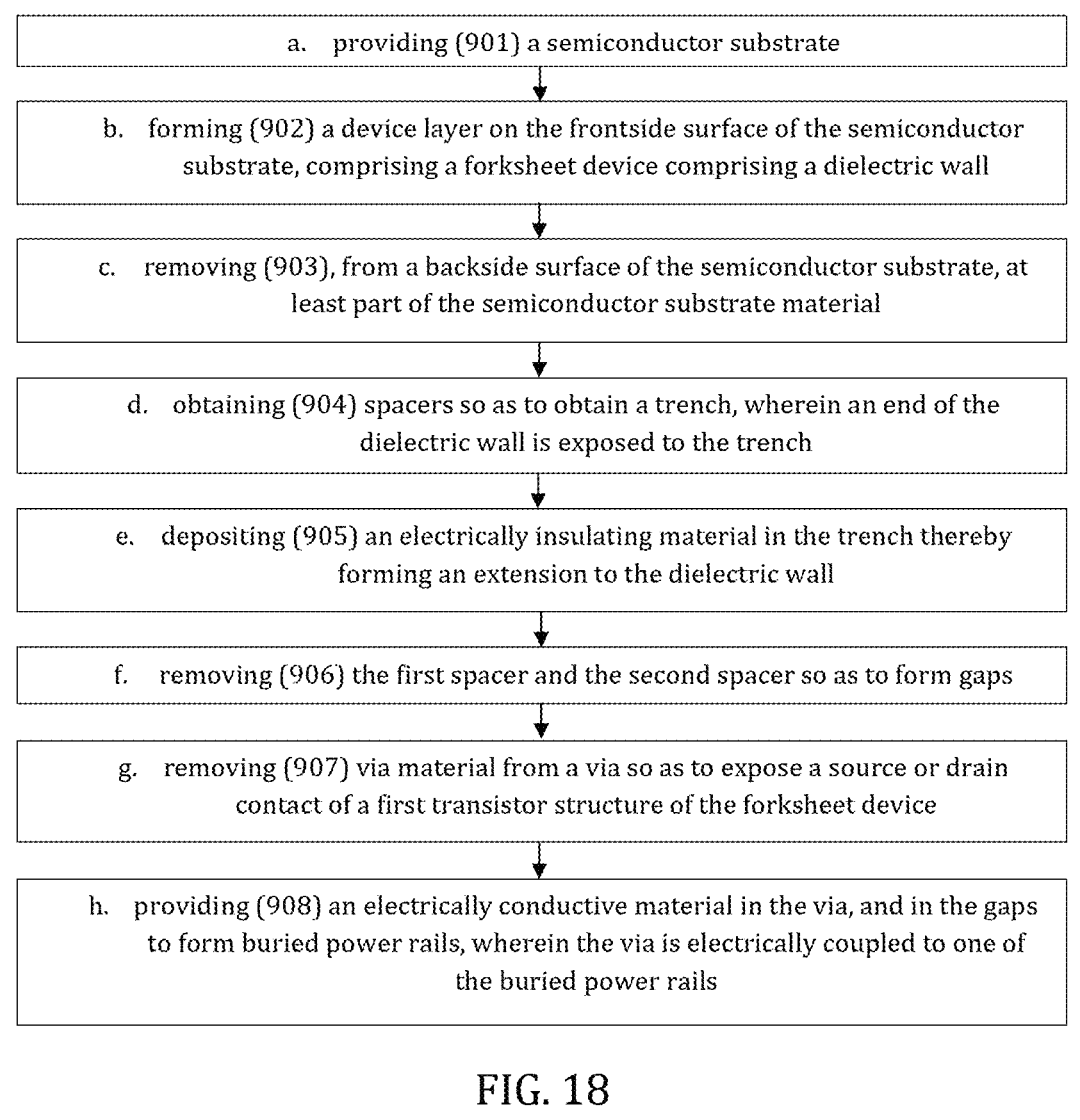

INTEGRATED CIRCUIT CHIPS COMPRISING FORKSHEET DEVICES CONNECTED WITH BURIED POWER RAILS

CROSS-REFERENCE

The present application claims priority from European Patent application no. 22216298.4, filed on Dec. 23, 2022, which is incorporated by reference in its entirety.

Technical Field of the Present Disclosure

The present disclosure relates to the field of integrated circuit chips comprising forksheet devices. More specifically, the present disclosure relates to integrated circuit chips comprising forksheet devices and buried power rails for providing power to the forksheet devices, and methods for forming such integrated circuit chips.

Background of the Present Disclosure

The field of semiconductor devices continuously evolves to further increase the density of semiconductor devices in the device layer of an integrated circuit chip. Typically, an interconnect layer comprising electrical interconnects interconnecting the different semiconductor devices in the device layer, is formed during back-end-of-line processing on the top side of the device layer. However, due to the increasing density of semiconductor devices, such as with the introduction of forksheet devices, manufacturing these electrical interconnects has become increasingly challenging.

A conventional solution is the use of buried power rails. These buried power rails are located below the device layer, i.e., on the side of the device layer opposite to that where the interconnect layer is located. The buried power rails may provide power to the semiconductor devices. By moving at least part of the power lines powering the semiconductor devices from the interconnect layer to below, i.e., to the back of, the device layer, more freedom of manufacturing may be achieved. Furthermore, the distance between the buried power rails and the semiconductor devices may be smaller than between interconnects in the interconnect layer and the semiconductor devices, which may result in a reduction of resistive losses.

However, in the state of the art, alignment between the buried power rails and the vias remains an issue, in particular due to wafer deformation that may occur, for example, during wafer bonding. Particular problems with respect to the alignment may arise when the semiconductor devices are forksheet devices, which usually comprise a first transistor structure comprising a p-type gate and a second transistor structure comprising an n-type gate, separated by a narrow dielectric wall. In embodiments, power is provided to the first transistor structure using a first buried power rail, and to the second transistor structure using a second buried power rail, different from the first buried power rail. This may require particularly careful alignment of the first buried power rail with a source or drain contact of the first transistor structure, and of the second buried power rail with a source or drain contact of the second transistor structure, while at the same time preventing electrical contact between the first and second buried power rail. This may be difficult to the very small distance separating the first and second transistor structure, which is typically equal to the width of the dielectric wall.

There is thus still a need in the art for devices and methods that address at least some of the above problems.

SUMMARY OF THE PRESENT DISCLOSURE

It is an object of the present disclosure to provide integrated circuit chips comprising buried power rails and methods for forming such chips or parts thereof, solving one or more of the problems present in the state of the art.

The above objective is accomplished by a method and apparatus according to the present disclosure.

It is a benefit of embodiments of the present disclosure that the two different transistor structures comprised in a forksheet device may be powered by different buried power rails. It is a further benefit of embodiments of the present disclosure that the buried power rails and the transistor structures of the forksheet device may be aligned.

It is a benefit of embodiments of the present disclosure that the integrated circuit chip comprising the different buried power rails connected to the different transistor structures of the forksheet device may be obtained using methods compatible with known manufacturing methods used for forming integrated circuit chips.

In a first aspect, the present disclosure relates to a method for forming an intermediate in the formation of an integrated circuit chip. The method comprises a step a. comprising providing a semiconductor substrate having a frontside surface and a backside surface opposite to the frontside surface. The method comprises a step b, after step a, comprising forming a device layer on the frontside surface of the semiconductor substrate. The device layer comprises a first transistor structure and a second transistor structure of a forksheet device. The device layer further comprises a device layer part, i.e., a part in the device layer, of a dielectric wall of the forksheet device horizontally, i.e., in a direction parallel to the frontside surface of the semiconductor substrate, separating the first transistor structure from the second transistor structure. The semiconductor substrate is provided with a substrate part, i.e., a part in the substrate, of the dielectric wall of the forksheet device. The semiconductor substrate further is provided with a first shallow trench isolation and a second shallow trench isolation, extending from the frontside surface of the semiconductor substrate vertically, i.e., perpendicular to the frontside surface of the semiconductor substrate, into the semiconductor substrate. A first of two largest opposing surfaces of said substrate part of the dielectric wall faces the first shallow trench isolation, and a second of the two largest opposing surfaces of said substrate part of the dielectric wall, opposite to the first of the two largest opposing surfaces, faces the second shallow trench isolation. Each of the first and second shallow trench isolation comprises an extending part located farther, in a direction from the frontside surface to the backside surface of the semiconductor substrate, from the frontside surface of the semiconductor substrate than an end of the dielectric wall in the semiconductor substrate facing the backside surface of the semiconductor substrate. The extending part of the first shallow trench isolation comprises a first surface facing a second surface of the extending part of the second shallow trench isolation. A region between the first surface and the second surface comprises a semiconductor substrate material. The substrate part of the dielectric wall is horizontally separated from the second shallow trench isolation by a further material. A via, filled with a via material, is provided contacting a source or drain contact of the first transistor structure and extending into the semiconductor substrate between the first shallow trench isolation and the substrate part of the dielectric wall.

The method further comprises, after step b, a step c comprising removing, by etching from the backside surface of the semiconductor substrate, opposite to the frontside surface of the semiconductor substrate, at least part of the semiconductor substrate material, selectively with respect to the via material, filling the via, and the further material, so as to expose the end of the dielectric wall in the semiconductor substrate, the first surface, and the second surface. Thereby, a gap is formed between the first surface and the second surface.

The method further comprises, after step c, a step d comprising obtaining a first spacer covering the first surface, wherein a surface of the first spacer facing the frontside surface of the semiconductor substrate overlaps with an end of the via in the semiconductor substrate, and a second spacer covering the second surface, wherein a surface of the second spacer facing the frontside surface of the semiconductor substrate overlaps with the further material, so as to obtain a trench between the first and second spacer, wherein the end of the dielectric wall in the semiconductor substrate is exposed to the trench.

The method further comprises, after step d, a step e, comprising depositing an electrically insulating material in the trench. Herein, the electrically insulating material contacts the end of the dielectric wall in the semiconductor substrate, thereby forming an extension to the dielectric wall.

It is a benefit of embodiments of the present disclosure that forming an extension is enabled, extending from the end of the dielectric wall in the semiconductor substrate of the forksheet device. A dielectric wall extending sufficiently deep into the semiconductor substrate, so as to allow the dielectric wall to separate a first buried power rail from a second buried power rail, is typically difficult to form from the frontside surface of the semiconductor substrate. Indeed, as the dielectric wall of the forksheet device is typically narrow, the aspect ratio of the substrate part of the dielectric wall, extending into the semiconductor substrate, may become large, which may complicate forming of a dielectric wall extending deep into the semiconductor substrate. The present disclosure enables solving this issue by forming the extension by processing from the backside surface of the semiconductor substrate. The extension may serve as a barrier for electrically separating a first buried power rail from a second buried power rail.

In embodiments, the semiconductor substrate provided in step a is formed of the semiconductor substrate material. The semiconductor substrate material may comprise, for example, silicon, germanium, or gallium nitride. The semiconductor substrate may, however, alternatively be a multi-layered/composite substrate, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

Step b comprises forming the forksheet device on the frontside surface of the semiconductor substrate, wherein the substrate part of the forksheet device extends into the semiconductor substrate. Step b further comprises forming the first and second shallow trench isolation in the semiconductor substrate. Both forming the forksheet device and the first and second shallow trench isolation are processes that are well-known to the skilled person, and may be performed using techniques that are well-known to the skilled person.

For example, in a typical process in accordance with embodiments of the present disclosure, first, a stack of alternating layers is formed on the frontside surface of the semiconductor substrate comprising layers of channel material, e.g., silicon, and layers formed of a sacrificial material, e.g., SiGe. In embodiments, the concentration of germanium in the layers formed of SiGe may be from 10 wt % to 50 wt %. Herein, the layers of SiGe may be sacrificial layers that may, at a later stage, be removed and be replaced by a gate stack. The stack of layers may be patterned to form line structures that may become nanosheet structures from the stack of layers. Herein, a trench may be formed separating a nanosheet structure for the first transistor structure and a nanosheet structure for the second transistor structure from each other, which may, at a later stage, be filled with a dielectric material to form the dielectric wall. In particular embodiments, step b comprises step b1 comprising forming, on the semiconductor substrate, a nanosheet structure for the first transistor structure and a nanosheet structure for the second transistor structure, horizontally separated from each other by a trench. Possibly, the trench separating the nanosheet structure for the first transistor structure and the nanosheet structure for the second transistor structure extends into the semiconductor substrate.

Subsequently, typically, formation of the first and second shallow trench isolation structure is performed, which may be performed using any technique as known to the skilled person. In embodiments, step b comprises step b2, after step b1, comprising forming a first shallow trench and a second shallow trench in the semiconductor substrate, and then step b3 comprising depositing an electrically insulating material in the first and second shallow trench, thereby forming the first shallow trench isolation and the second shallow trench isolation, respectively. Both formation of the first and second shallow trench, and subsequent filling thereof with the electrically insulating material, are processes that are well-known to the skilled person and are, therefore, not further described here.

Typically, the first and second shallow trench isolations and the dielectric wall are provided in step b so that a distance from the frontside surface of the semiconductor substrate to the end of the dielectric wall in the semiconductor substrate is smaller than the distance from the frontside surface of the semiconductor substrate to the surface of the first shallow trench isolation facing the backside surface of the semiconductor substrate, and smaller than the distance from the frontside surface of the semiconductor substrate to the surface of the second shallow trench isolation facing the backside surface of the semiconductor substrate. In embodiments, the extending part of the first and second shallow trench isolation is the part extending from a distance from the frontside surface of the semiconductor substrate that is equal to a distance from the frontside surface of the semiconductor substrate to the end of the dielectric wall in the semiconductor substrate, to the surface of the first and second shallow trench isolation facing the backside of the semiconductor substrate, respectively. In embodiments, a distance from the frontside surface of the semiconductor substrate to the end of the dielectric wall in the semiconductor substrate is from 1 to 50 nm, usually from 5 to 10 nm. In embodiments, the shallow trench isolations are provided in step b so that a distance from the frontside surface of the semiconductor substrate to the surface of the first shallow trench isolation facing the backside surface of the semiconductor substrate is from 20 to 200 nm, from 50 to 100 nm, or from 50 to 90 nm. In embodiments, a distance from the frontside surface of the semiconductor substrate to the surface of the second shallow trench isolation facing the backside surface of the semiconductors substrate is from 20 to 200 nm, from 50 to 100 nm, or from 50 to 90 nm. Typically, the first and second shallow trench isolation have substantially the same dimensions.

After forming the first and second shallow trench isolation, the dielectric wall of the forksheet device is typically formed. This may comprise depositing an oxide in the trench separating the nanosheet structure for the first transistor structure and the nanosheet structure for the second transistor structure from each other, that was formed when patterning the stack of layers. This trench may extend into the semiconductor substrate. However, alternatively, the forming of the shallow trenches for the first and second shallow trench isolation in step b2 may, simultaneously, extend the trench between the nanosheet structures into the semiconductor substrate. Subsequently, the part of the trench in the semiconductor substrate may be filled with the dielectric material deposited when forming the first and second shallow trench isolation, which then forms the part of the dielectric wall in the semiconductor substrate. As such, in embodiments, step b further comprises step b4 comprising forming the dielectric wall by filling the trench separating the nanosheet structure for the first transistor structure and the nanosheet structure for the second transistor structure with a dielectric material.

In embodiments, a distance, in a horizontal direction, from the first shallow trench isolation to the dielectric wall is from 20 to 500 nm, usually from 50 to 200 nm. In embodiments, a distance, in a horizontal direction, from the second shallow trench isolation to the dielectric wall is from 20 to 500 nm, from 50 to 200 nm, or from 50 to 90 nm. In embodiments, a distance, in a horizontal direction, from the first shallow trench isolation to the dielectric wall is within 10%, usually within 5%, of a distance, in a horizontal direction, from the second shallow trench isolation to the dielectric wall. It is a benefit of these embodiments that having the dielectric wall located substantially in the middle between the first shallow trench isolation and the second shallow trench isolation, a symmetric extension of the dielectric wall may be obtained.

After formation of the dielectric wall, a dummy gate may be formed, followed by the formation of inner spacers, and the line structures from the patterned stack of layers forming the nanosheet structures may be further etched to form regions for providing the source or drain contacts. These steps are well-known to the skilled person and are therefore not further described.

In some embodiments, step b comprises step b5 comprising forming a recess in the semiconductor substrate between the first shallow trench isolation and the dielectric wall, thereby forming at least part of the via, and then step b6 comprising depositing the via material that is, typically, a material different from the semiconductor material, such as a sacrificial material, so as to fill the at least part of the via. This is not essential, and instead, no recess may be formed in the semiconductor substrate, so that the via material in the via may comprise the semiconductor substrate material. The semiconductor substrate material in the via may then be removed during backside processing in step g to expose the source or drain contact, using any lithography technique from the backside known to the ordinary skilled person. However, in that case, good alignment of the lithography, so that indeed the via material, e.g., only the via material, is removed, may be difficult. Indeed, depositing the sacrificial material during frontside processing in the recess to form at least part of the via may result in good alignment between the via and the source or drain contact, that may be formed in contact with the sacrificial material. When the via is the sacrificial material, removing the sacrificial material selectively during backside processing, selectively with respect to the semiconductor substrate material, which may be located at locations between the dielectric wall and the first and second shallow trench isolation structures, different from the location of the via, may expose the source or drain contact of the first transistor device, without exposing any other features in the device layer.

In embodiments, in step b5, and step b6, the recess, and the via material, e.g., the sacrificial material, does not protrude from between the first shallow trench isolation and the substrate part of the dielectric wall, farther, in a direction from the frontside surface to the backside surface, into the semiconductor substrate. In embodiments, the sacrificial material deposited in step b6 comprises $SiO_2$ with a liner formed of SiN, SiCO, SiOCN, or SiON, usually SiN, that is, wherein the sacrificial material is deposited in the recess by depositing the liner formed of SiN, SiCO, SiOCN, or SiON in the recess covering surfaces of the recess, and subsequently depositing $SiO_2$ covering the liner. This may be performed during frontside processing, in step b, as described above. In these embodiments, removing the sacrificial material, that is, from the backside, in step g (see below), comprises removal of the SiN liner, and subsequent removal of the $SiO_2$.

Step b5 may be performed selectively, so that only the semiconductor substrate between the first shallow trench isolation and the dielectric wall is recessed, which may be performed using any lithographic technique known to the person skilled in the art during frontside processing. However, in embodiments, step b5 may instead be performed non-selectively, so that also the semiconductor substrate between the second shallow trench isolation and the dielectric wall is recessed. In these embodiments, the material different from the semiconductor material, such as the sacrificial material, may in that case also be deposited, in step b6, in the recess between the second shallow trench isolation and the dielectric wall. In these embodiments, the further material may also be the sacrificial material.

After step b4, and, if present, after step b6, the source or drain contacts may be formed, which is typically performed by epitaxial growth from the nanosheet structures. The thus grown source or drain contacts typically contact the via material. In embodiments, step b comprises step b7, after step b6, comprising forming the source or drain contact in contact with the sacrificial material.

Next, a replacement gate process may be performed on the nanosheet structure. Herein, the sacrificial layers comprising SiGe of the patterned stack of layers forming the nanosheet structures may be removed and a gate stack may be formed around the channel material, i.e., the layers of channel material (i.e., silicon) in the nanosheet structures. Herein, the layers of channel material in the nanosheet structure may be doped, i.e., n-doped or p-doped, which may be performed using techniques known to the skilled person. Typically, the silicon layers of one of the first or second transistor structure is doped to form n-doped silicon layers, and another of the first or second transistor structure is doped to form p-doped silicon layers. To achieve this, as is known to the skilled person, a mask may be applied, enabling introducing a different type of doping in the two nanosheet structures of the forksheet device. The doped silicon layers form the channels of the transistor structures. Thereafter, frontside interconnects may be formed in the device layer that may connect the forksheet devices with the frontside interconnect layer that may be subsequently formed.

The first transistor structure may at least comprise the nanosheet structure for the first transistor structure, the source or drain contact that is for the first transistor structure, a further source or drain contact, and a gate. The second transistor structure may at least comprise the nanosheet structure for the second transistor structure, a source or drain contact for the second transistor structure, and a further source or drain contact for the second transistor structure, and a gate. Typically, the source or drain contact of the second transistor structure is located over the further material located between the substrate part of the dielectric wall and the second shallow trench isolation, at an opposite side of the dielectric wall from the source or drain contact of the first transistor structure. In embodiments, the first and second transistor structure are field effect transistors.

In embodiments, step b comprises forming, after forming the nanosheet structures, a bottom dielectric isolation. Forming the bottom dielectric isolation is well-known to the skilled person, and any technique for forming the bottom dielectric isolation may be applied. In embodiments, said forming of the bottom dielectric isolation comprises removing a bottom part of the nanosheet structures so as to form a gap between the nanosheet structures and the semiconductor substrate. Forming the bottom dielectric isolation may be performed independently with respect to filling the recess in step b6. For example, the recess may be filled with a via material, and afterwards, the bottom dielectric isolation may be deposited, filling the gap between the nanosheet structures and the semiconductor substrate. However, in particular embodiments, the bottom dielectric isolation comprises the same material as the via material. In these embodiments, the bottom dielectric isolation may be formed by overfilling the recess with the via material, e.g., the sacrificial material, so as to fill the gap between the nanosheet structures and the semiconductor substrate, thereby forming the bottom dielectric isolation. The bottom dielectric isolation may provide electrical insulation and prevent subchannel leakage between the channels of the first and second field effect transistor and the semiconductor substrate. In embodiments, the via may extend from into the semiconductor substrate, through the bottom dielectric isolation (e.g., the via material may comprise part of the bottom dielectric isolation material separating the source or drain contact from the semiconductor substrate), contacting the source or drain contact of the first transistor structure.

Although the step order and techniques described above may be typically used in step b of embodiments of the present disclosure, the present disclosure is not limited thereto, and other step orders and techniques known to the person skilled in the art may be used instead.

Step b typically comprises, after forming the device layer, forming a frontside interconnect layer on a frontside surface of the device layer, facing away from the semiconductor substrate. Forming the frontside interconnect layer may conclude the frontside processing of the method. After step b and before step c, the structure, comprising the semiconductor substrate and the device layer and typically the frontside interconnect layer, is flipped and bonded to a carrier wafer, with the frontside surface of the semiconductor substrate facing the carrier wafer, e.g., wherein the carrier wafer is bonded onto the frontside interconnect layer. Any suitable industry standard bonding technique may be used for this purpose. The semiconductor substrate is subsequently thinned from the backside surface, that is, by removing the semiconductor substrate material, in step c.

This typically exposes the end of the dielectric wall in the semiconductor substrate, and the first and second shallow trench isolations, and typically also the via material and the further material. The thinning process may comprise one or more of grinding, chemical mechanical polishing and/or etch back. The steps after the frontside processing of step b, i.e., at least steps c through e, and, if present, steps f through h, are typically performed by backside processing.

Removing of the semiconductor substrate material from the backside surface in step c generally comprises exposing the further material and the via material. In embodiments, after step c, the further material does not protrude from between the second shallow trench isolation and the substrate part of the dielectric wall. Generally, removing the semiconductor substrate material in step c is performed such that an end of the via material in the semiconductor substrate, and a (e.g., bottom) surface of the further material are substantially coplanar with the end of the dielectric wall in the semiconductor substrate. It is a benefit of these embodiments that the first and second spacer, formed in step d, may cover the complete first and second surface of the first and second shallow trench isolation. Furthermore, this may result in a uniform deposition of a liner for forming the first and second spacer. This may result in the extension having a uniform width. Furthermore, when the sacrificial material and the further material would extend farther, in a direction from the frontside surface to the backside surface of the semiconductor substrate, into the semiconductor substrate than the dielectric wall, said end of the dielectric wall may be covered by the sacrificial material or the further material, so that the extension may not form on the end of the dielectric wall.

In embodiments, as described above, the further material is the same material as the semiconductor substrate material. In these embodiments, step c of removing at least part of the semiconductor substrate material is terminated when the further material horizontally separating the dielectric wall from the second shallow trench isolation is reached. In other words, the selectivity between the semiconductor substrate material and the further material, formed of the same material as the semiconductor substrate material, is achieved by terminating the removal once the further material is reached, i.e., using a timed etch. Also the via material may be formed of the semiconductor substrate material, in which case the removal of the semiconductor substrate material is terminated when the via material in the via is reached as well.

In embodiments, the via material refers to the material in the via and may be any type of material, e.g., a combination of materials. In some embodiments, the via material, and possibly also the further material, comprises, e.g., is formed of, the sacrificial material. It is a benefit of these embodiments that the semiconductor substrate material may, in step c, be removed by a selective etch, and no timed etch may be necessary.

In embodiments, in step c, removing at least part of the semiconductor substrate material comprises exposing a surface of the via material, facing away from the frontside surface of the semiconductor substrate, that is coplanar with the end of the dielectric wall in the semiconductor substrate, and exposing the further material horizontally separating the dielectric wall from the second shallow trench isolation such that a surface of the further material, facing away from the frontside surface of the semiconductor substrate, is coplanar with end of the dielectric wall in the semiconductor substrate. In these embodiments, in step d., the first spacer is obtained covering, e.g., completely covering, the via material and the second spacer is obtained covering, e.g., completely covering, the further material. It is a benefit that these embodiments may prevent overlap between the extension and the via material. It is a benefit of these embodiments that the extension may have a width, in a direction from the first of two largest opposing surfaces of the substrate part of the dielectric wall to the second of two largest opposing surfaces of the substrate part of the dielectric wall, that is substantially equal to a width of the dielectric wall in said direction.

In embodiments, obtaining the first and second spacer of step d comprises:

d1.: depositing a dielectric liner covering a backside surface of the semiconductor substrate, which may be performed using any technique known to the skilled person, such as atomic layer deposition, and d2.: anisotropically etching the deposited dielectric liner so as to form the first and second spacer.

In embodiments, step d1 of depositing the dielectric liner comprises performing atomic layer deposition. Atomic layer deposition may allow for uniform deposition of the material for forming the first and second spacer on the first and second surface. Said anisotropic etching may also be performed using any technique known to the skilled person, such as a fluorine-based etching technique. In these embodiments, the first shallow trench isolation and the second shallow trench isolation are used as mandrels for forming the first and second spacer. In embodiments, the dielectric liner comprises SiN, SiCN, or SiOCN.

In embodiments, step e. of depositing an electrically insulating material in the trench comprises depositing $AIO_x$, SiCN, or $TiO_2$. The material of the electrically insulating material is usually different from the material forming the first and second spacer, so that the latter may be removed selectively by etching. The electrically insulating material may be deposited, and subsequently, an etch back may be performed so that only the electrically insulating material located in the trench remains.

In embodiments, the method comprises, after step e, step f comprising removing the first spacer and the second spacer, e.g., using a selective etch that is known to the skilled person, thereby forming a gap between the first surface and the extension and a gap between the second surface and the extension.

In embodiments, the method further comprises, after step f, step g comprising removing the via material from the via so as to expose the source or drain contact of the first transistor structure. If the via material is the sacrificial material, and the further material is the semiconductor substrate material, a selective etch may be performed to remove the sacrificial material and open the via. As described above, in some embodiments, the further material is the same material as the via material. In some embodiments, the further material and the via material are formed of the sacrificial material. To selectively remove the via material in the via, without removing the further material, lithography may be performed on the backside surface of the semiconductor substrate. That is, in these embodiments, step g of removing the via material from the via may comprise:

g1. forming a patterned mask exposing the via material in the via, and g2. etching the exposed via material.

In embodiments, the method further comprises, after step g, step h comprising providing an electrically conductive material:

in the via, electrically coupled to the source or drain contact, in the gap between the first surface and the extension, thereby forming a first buried power rail electrically coupled to the electrically conductive material in the via, and in the gap between the second surface and the extension, thereby forming a second buried power rail, separated from the first buried power rail by the extension.

In embodiments, step h may further comprise performing chemical mechanical polishing so as to co-planarize a backside surface of each of the first and second shallow trench isolation, the extension, and each of the first and second buried power rail. Herein, the backside surfaces face away from the frontside surface of the semiconductor substrate. Typically, the electrically conductive material is deposited overfilling the gap between the first surface and the extension and the gap between the second surface and the extension. Thereby, the electrically conductive material may cover the end of the extension, so that there may be electrical contact between the electrically conductive material in the gap between the first surface and the extension and the electrically conductive material in the gap between the second surface and the extension. Said chemical mechanical polishing typically comprises chemical mechanical polishing the electrically conductive material, so that the backside surface of the electrically conductive material in both gaps is coplanar with the backside surface of the extension. To enable said coplanarization between the electrically conductive material and the end of the extension, the chemical mechanical polishing may also comprise removal of part of the (extending part of the) first and second shallow trench isolation.

Any features of any embodiment of the first aspect may be independently as correspondingly described for any embodiment of the second aspect of the present disclosure.

In a second aspect, the present disclosure relates to an integrated circuit chip comprising a device layer on a frontside surface of a substrate comprising a device layer part of a dielectric wall of a forksheet device, a first transistor structure of the forksheet device, and a second transistor structure of the forksheet device. The device layer part of the dielectric wall separates the first transistor structure from the second transistor structure. The integrated circuit chip further comprises the substrate, which, in embodiments of the second aspect of the present disclosure, comprises buried power rails and may be called the back contact layer, comprising a substrate part of the dielectric wall. The substrate further comprises an extension to the dielectric wall extending from an end of the dielectric wall in the substrate. The substrate, i.e., back contact layer, further comprises a first shallow trench isolation and a second shallow trench isolation, horizontally separated from each other, each comprising an extending part located farther into the substrate than an end of the dielectric wall in the substrate, in a direction from the frontside surface to the backside surface of the semiconductor substrate. A first of two largest opposing surfaces of said substrate part of the dielectric wall faces the first shallow trench isolation, and a second of the two largest opposing surfaces of said substrate part, opposite to the first of the two largest opposing surfaces, faces the second shallow trench isolation. A via, filled with an electrically conductive material, extends between the first shallow trench isolation and the substrate part of the dielectric wall. The electrically conductive material of the via is electrically coupled to a source or drain contact of the first transistor structure. A further material separates the second shallow trench isolation and the substrate part of the dielectric wall. The substrate comprises a first buried power rail between a first surface of the extending part of the first shallow trench isolation, facing the extension, and the extension, the first buried power rail being electrically coupled to the electrically conductive material of the via. The substrate further comprises a second buried power rail between a second surface of the extending part of the second shallow trench isolation, facing the extension, and the extension, the second buried power rail being electrically separated from the first buried power rail by the extension.

In embodiments, a height that is in a direction from a backside surface of the substrate, opposite to the frontside surface of the substrate, to the frontside surface of the substrate, of the first and second buried power rail is equal to a height that is in the same direction of the extension.

In embodiments, the first and second transistor structure each comprise a field-effect transistor. In embodiments, the first transistor structure comprises a channel selected from an n-doped channel and a p-doped channel, and the second transistor structure comprises another channel selected from the n-doped channel or the p-doped channel.

In embodiments, the extension is formed of $AIO_x$, SiCN, or $TiO_2$. It is a benefit of these embodiments that these materials may provide good electrical insulation.

The dielectric wall may formed of materials that are typically used, and may comprise the same material as the extension, or a different material.

Typically, the substrate part of the dielectric wall comprises two pairs of opposing surfaces, namely a pair of two smallest, by area, opposing surfaces, that are at ends of the dielectric wall, and a pair of the two largest, by area, opposing surfaces. In embodiments, a width of the dielectric wall, in a direction from the first of the two largest opposing surfaces to the second of the two largest opposing surfaces, is from 5 to 50 nm, from 10 to 25 nm, or from 5 to 10 nm. In embodiments, a width of the extension, in said direction, is within at most 50%, within at most 20%, or within at most 10%, of the width of the dielectric wall. Typically, the two largest opposing surfaces are parallel with respect to each other.

In some embodiments, a length of the extension, in a direction from the frontside surface of the substrate to the end of the extension facing away from the dielectric wall, is from 1 nm to 50 nm, for example, from 3 nm to 20 nm, or from 5 to 10 nm. In some embodiments, a width of the end of the extension facing away from the dielectric wall, in a direction from the first of the two largest opposing surfaces to the second of the two largest opposing surfaces of the dielectric wall, is within 50%, for example within 20%, e.g., within 10%, of a width in said direction of the end of the dielectric wall in the substrate.

In embodiments, an angle between each of the two largest opposing surfaces and a direction from the backside surface of the substrate to the frontside surface of the substrate, is at most 20°, usually at most 10°. In some embodiments, the two largest opposing surfaces are aligned vertically. In some embodiments, the two largest opposing surfaces are parallel with respect to each other. In embodiments, in a horizontal cross-section through the first shallow trench isolation and the dielectric wall, an angle between the first surface of the extending part of the first shallow trench isolation and the first of the two largest opposing surfaces, is at most 20°, usually at most 10°. In embodiments, in a horizontal cross-section through the second shallow trench isolation and the dielectric wall, an angle between the second surface of the extending part of the second shallow trench isolation and the second of the two largest opposing surfaces, is at most 20°, usually at most 10°. In embodiments, an angle between each of the first and second surface and a direction from the backside surface of the substrate to the frontside surface of the substrate, is at most 20°, usually at most 10°. In some embodiments, the first surface and the second surface are parallel with respect to each other.

Any features of any embodiment of the second aspect may be independently as correspondingly described for any embodiment of the first aspect of the present disclosure.

Particular aspects of the present disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and benefits of the present disclosure will become apparent from the following detailed description, taken in conjunction with the accompanying drawings, which illustrate, by way of example, the principles of the present disclosure. This description is given for the sake of example only, without limiting the scope of the present disclosure. The reference figures quoted below refer to the attached drawings.

BRIEF DESCRIPTION OF THE DRAWINGS

FIG. 1A, FIG. 1B and FIG. 1C are schematic representations of an entity comprising a device layer on a semiconductor substrate for use in a method in accordance with embodiments of the present disclosure, wherein FIG. 1A is a top view, and FIG. 1B, FIG. 1C and FIG. 1D are vertical cross-sections, across the gate, perpendicular to the gate and along the gate, respectively.

FIG. 2A, FIG. 2B and FIG. 2C are schematic representations of an entity comprising a device layer on a semiconductor substrate for use in a method in accordance with embodiments of the present disclosure, wherein FIG. 2A is a top view, and FIG. 2B and FIG. 2C are vertical cross-sections, perpendicular to the gate and along the gate, respectively.

FIG. 3A, FIG. 3B and FIG. 3C are schematic representations of an entity comprising a device layer on a semiconductor substrate for use in a method in accordance with embodiments of the present disclosure, wherein FIG. 3A is a top view, and FIG. 3B and FIG. 3C are vertical cross-sections, perpendicular to the gate and along the gate, respectively.

13

Figure 7:
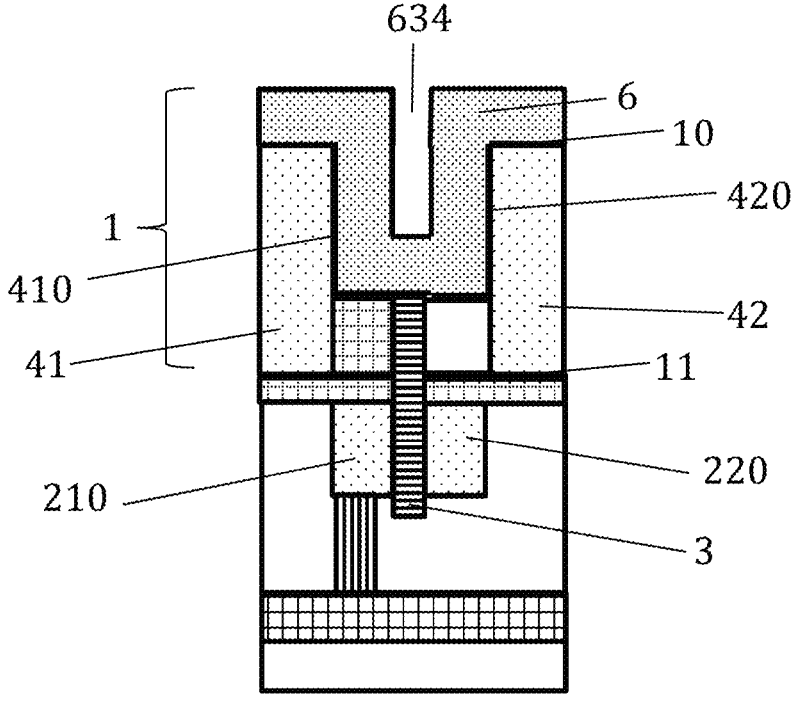

FIG. 7 is a schematic representation of a vertical cross-section, along the gate, of the entity, after forming a liner over a backside surface of the entity, for use in a method in accordance with embodiments of the present disclosure.

Figure 8:
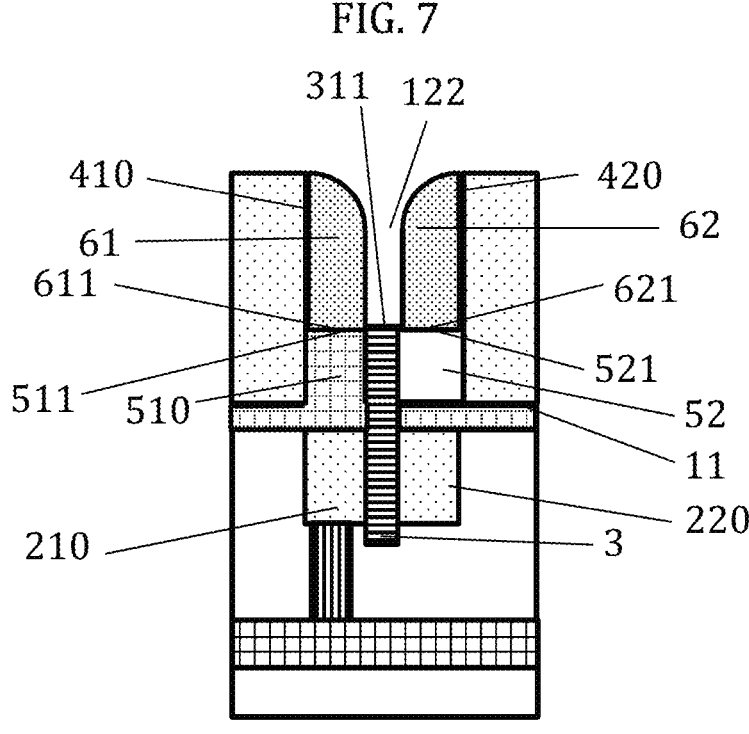

FIG. 8 is a schematic representation of a vertical cross-section, along the gate, of the entity, after anisotropically etching the liner to form spacers separated by a trench, for use in a method in accordance with embodiments of the present disclosure.

Figure 9:
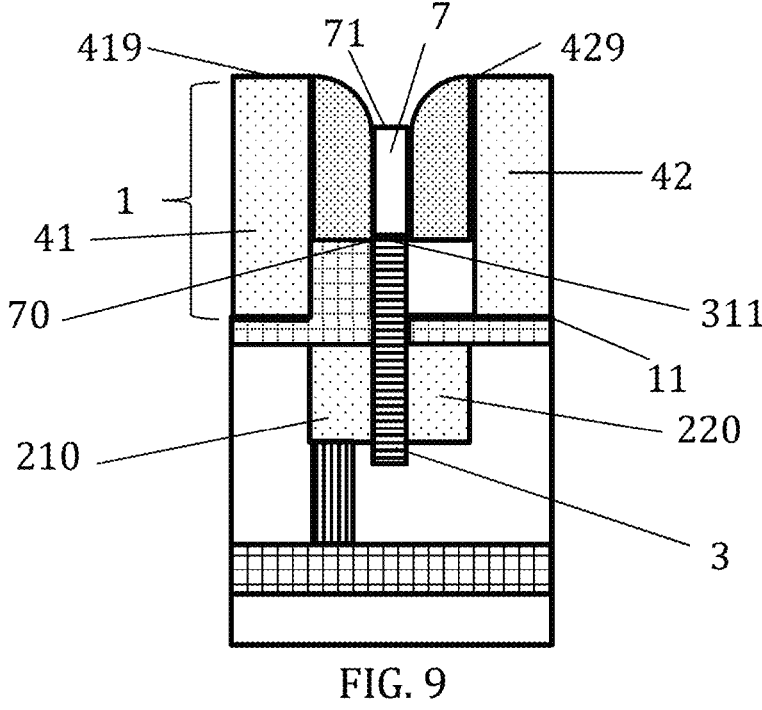

FIG. 9 is a schematic representation of a vertical cross-section, along the gate, of the entity, after filling the trench with an electrically insulating material to form an extension, for use in a method in accordance with embodiments of the present disclosure.

Figure 10:
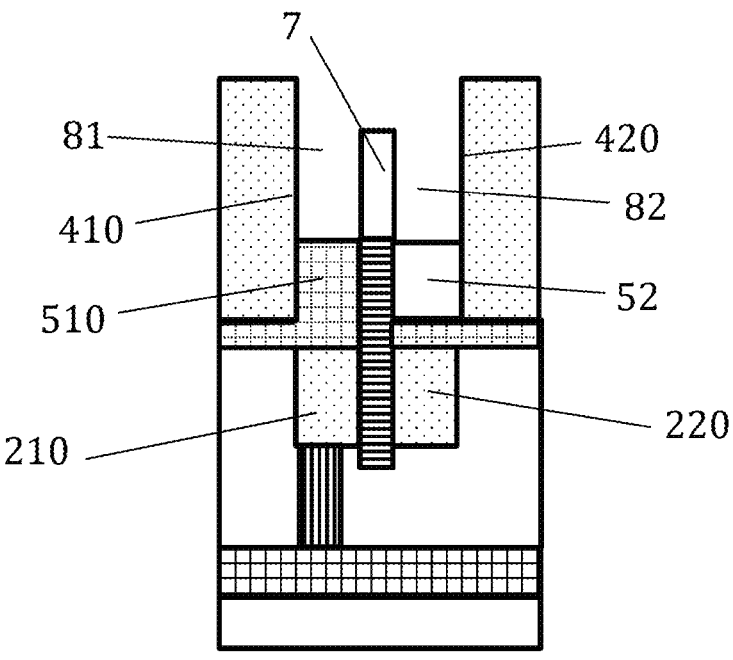

FIG. 10 is a schematic representation of a vertical cross-section, along the gate, of the entity, after removing the spacers, for use in a method in accordance with embodiments of the present disclosure.

Figures 11, 12:
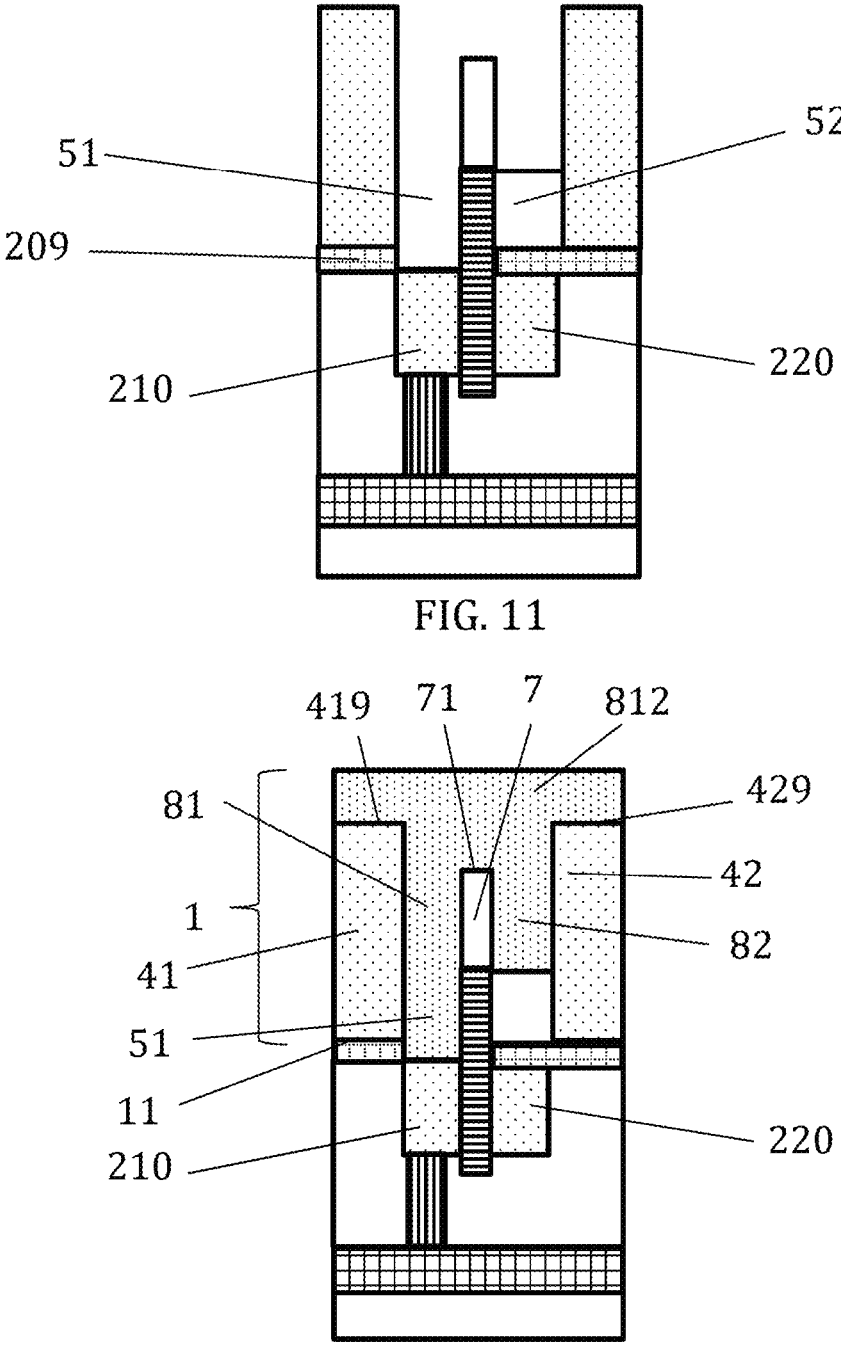

FIG. 11 is a schematic representation of a vertical cross-section, along the gate, of the entity, after removing the sacrificial material from the via, for use in a method in accordance with embodiments of the present disclosure.

FIG. 12 is a schematic representation of a vertical cross-section, along the gate, of the entity, after depositing an electrically conductive material, for use in a method in accordance with embodiments of the present disclosure.

Figure 13:
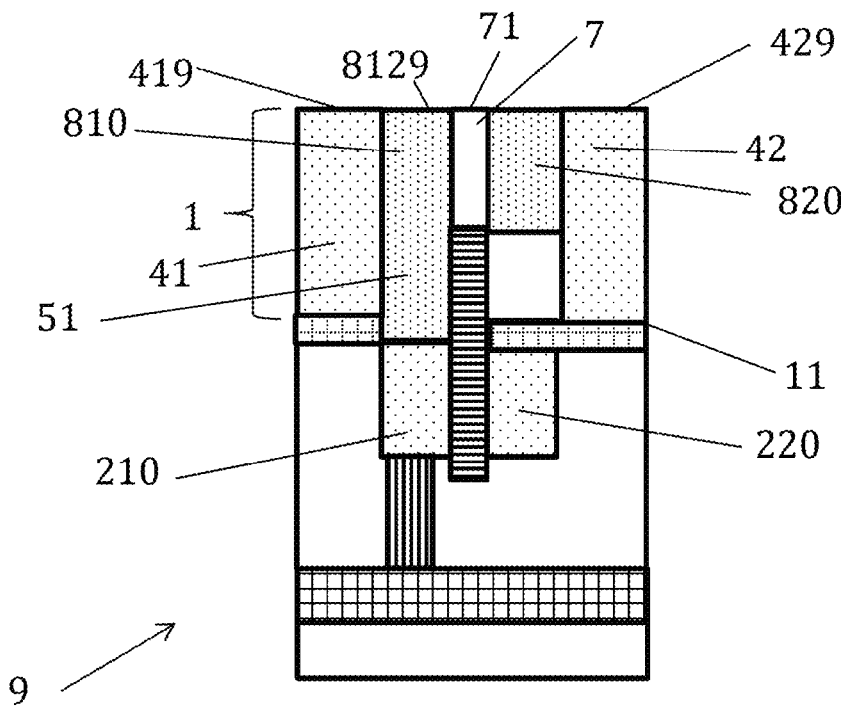

FIG. 13 is a schematic representation of a vertical cross-section, along the gate, of the entity, after chemical mechanical polishing, of an integrated circuit chip in accordance with embodiments of the present disclosure.

Figure 14:
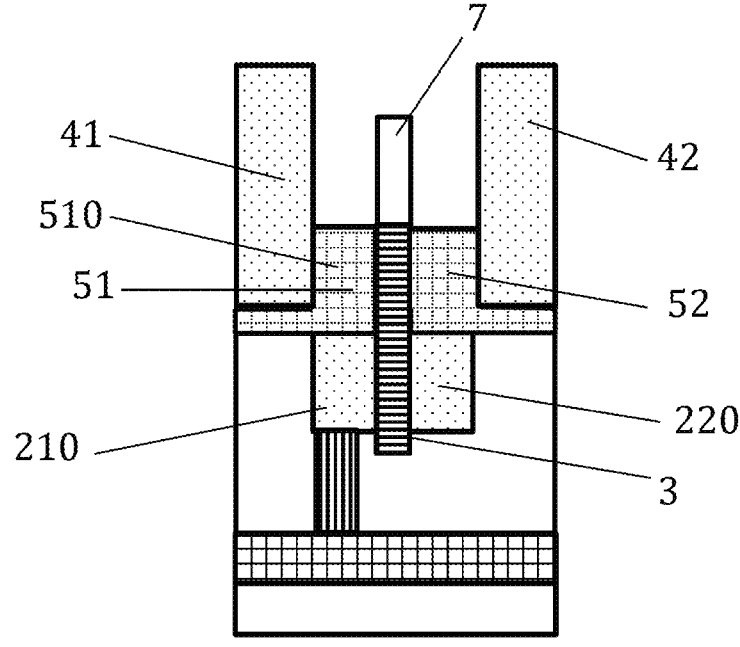

FIG. 14 is a schematic representation of a vertical cross-section, along the gate, of an alternative entity, wherein the sacrificial material is non-selectively obtained in the semiconductor substrate, for use in a method in accordance with embodiments of the present disclosure.

Figure 15:
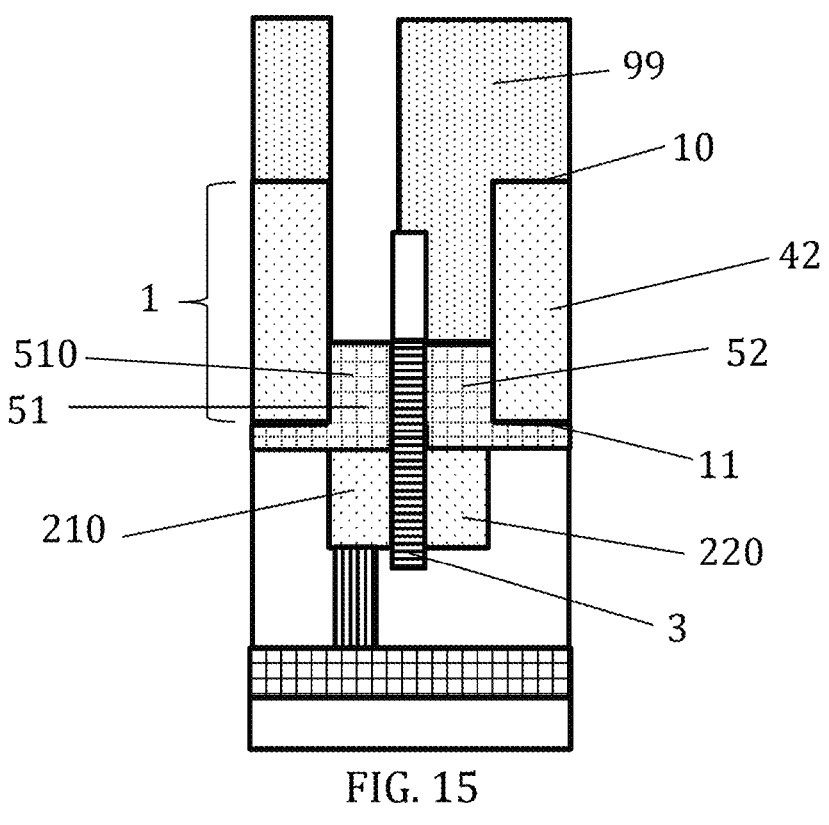

FIG. 15 is a schematic representation of a vertical cross-section, along the gate, of the alternative entity, wherein a patterned mask is deposited on a backside surface of the entity, for use in a method in accordance with embodiments of the present disclosure.

Figure 16:
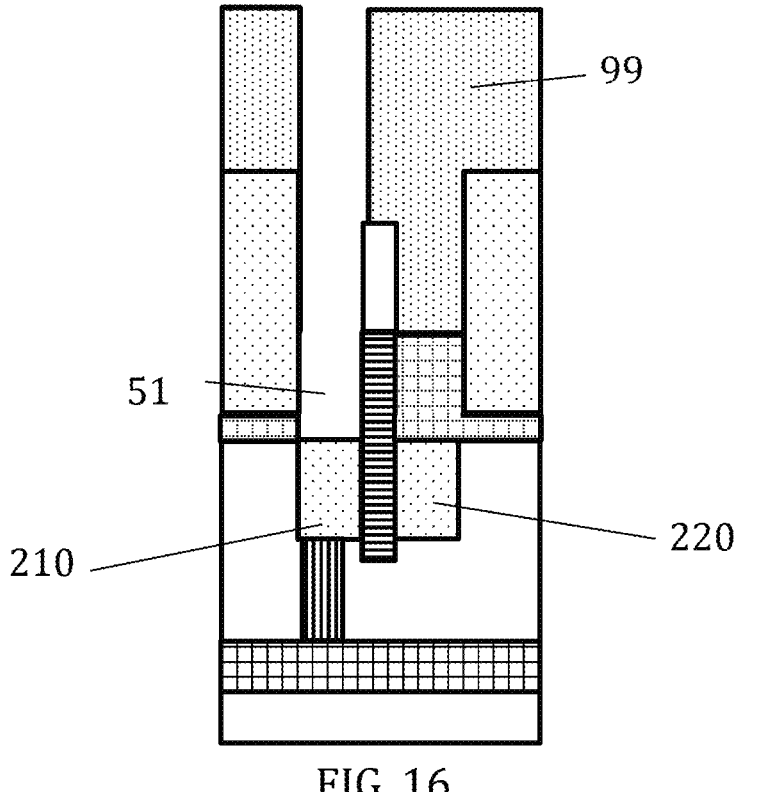

FIG. 16 is a schematic representation of a vertical cross-section, along the gate, of the alternative entity, after selectively removing the sacrificial material in the via, for use in a method in accordance with embodiments of the present disclosure.

Figure 17:
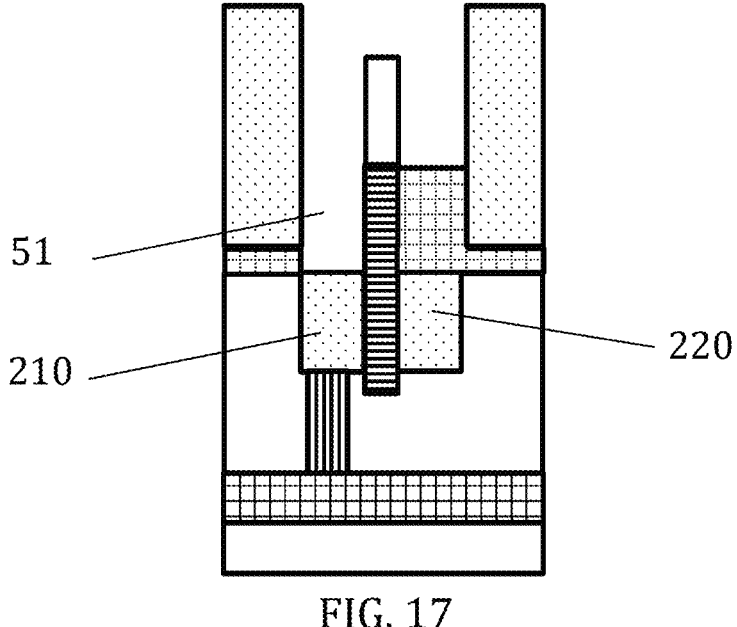

FIG. 17 is a schematic representation of a vertical cross-section, along the gate, of the alternative entity, after removing the patterned mask, for use in a method in accordance with embodiments of the present disclosure.

FIG. 18 is a block diagram indicating the different steps of a method in accordance with embodiments of the present disclosure.

In the different figures, the same reference signs refer to the same or analogous elements.

DETAILED DESCRIPTION OF ILLUSTRATIVE EMBODIMENTS

The present disclosure will be described with respect to particular embodiments and with reference to certain drawings but the present disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the present disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the present disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the present disclosure, various features of the present disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed present disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the present disclosure.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

The present disclosure will now be described by a detailed description of several embodiments of the present disclosure. It is clear that other embodiments of the present disclosure can be configured according to the knowledge of persons skilled in the art without departing from the technical teaching of the present disclosure, the present disclosure being limited only by the terms of the appended claims.

Simultaneous reference will be made to FIG. 18, that is a block diagram of a method in accordance with embodiments of the present disclosure.

Figures 1A, 1B:
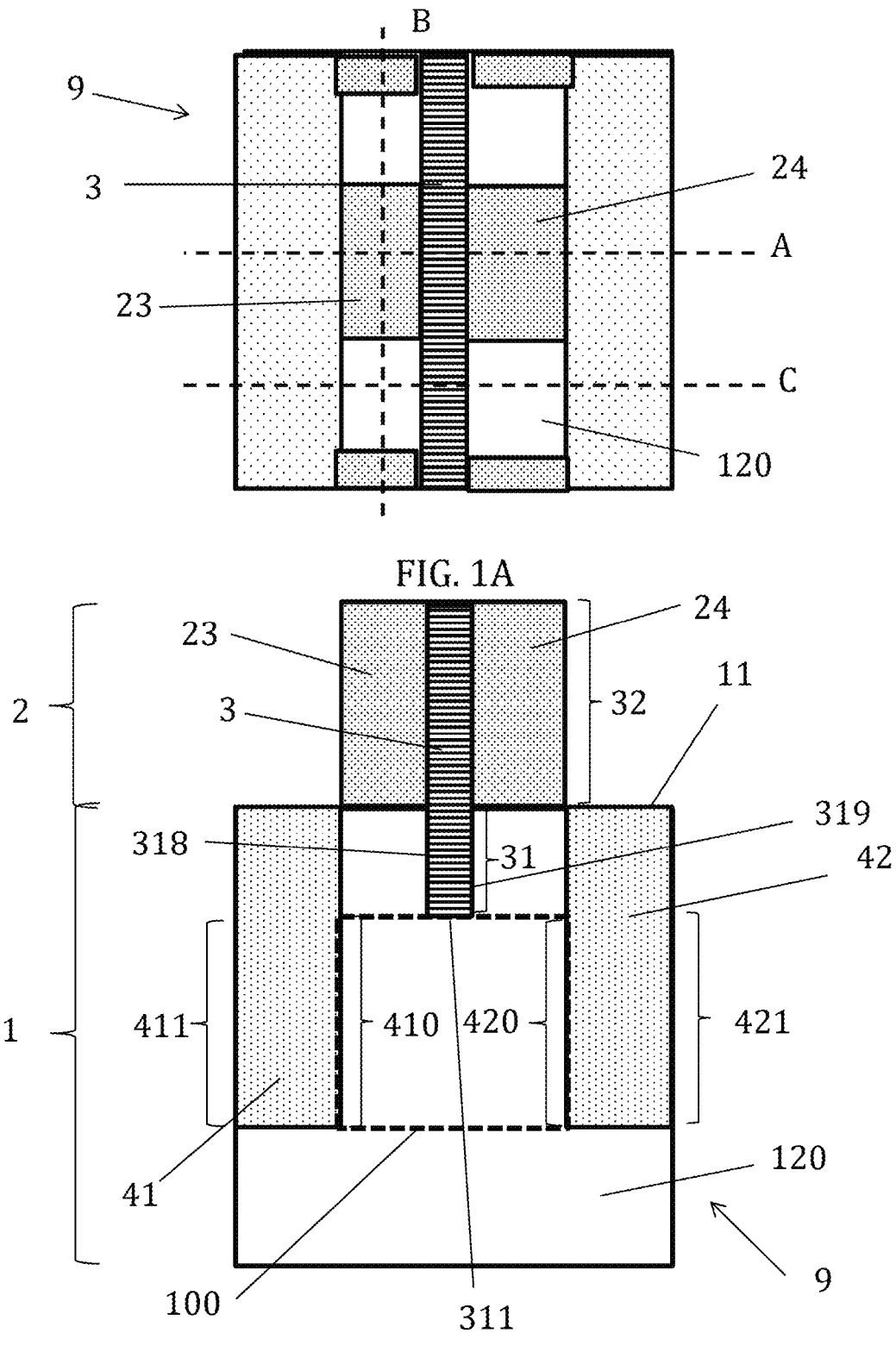
Figure 1C:
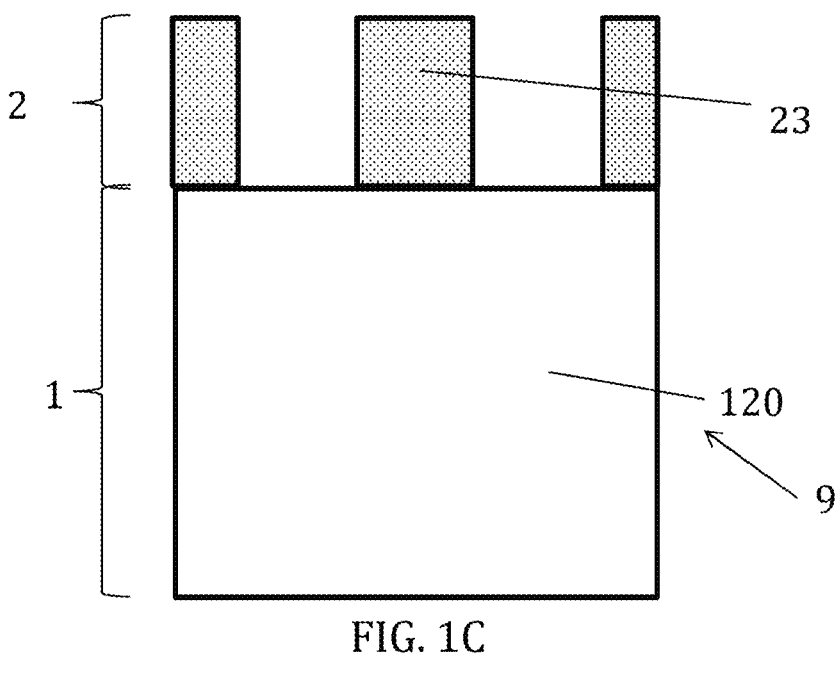
Figure 1D:
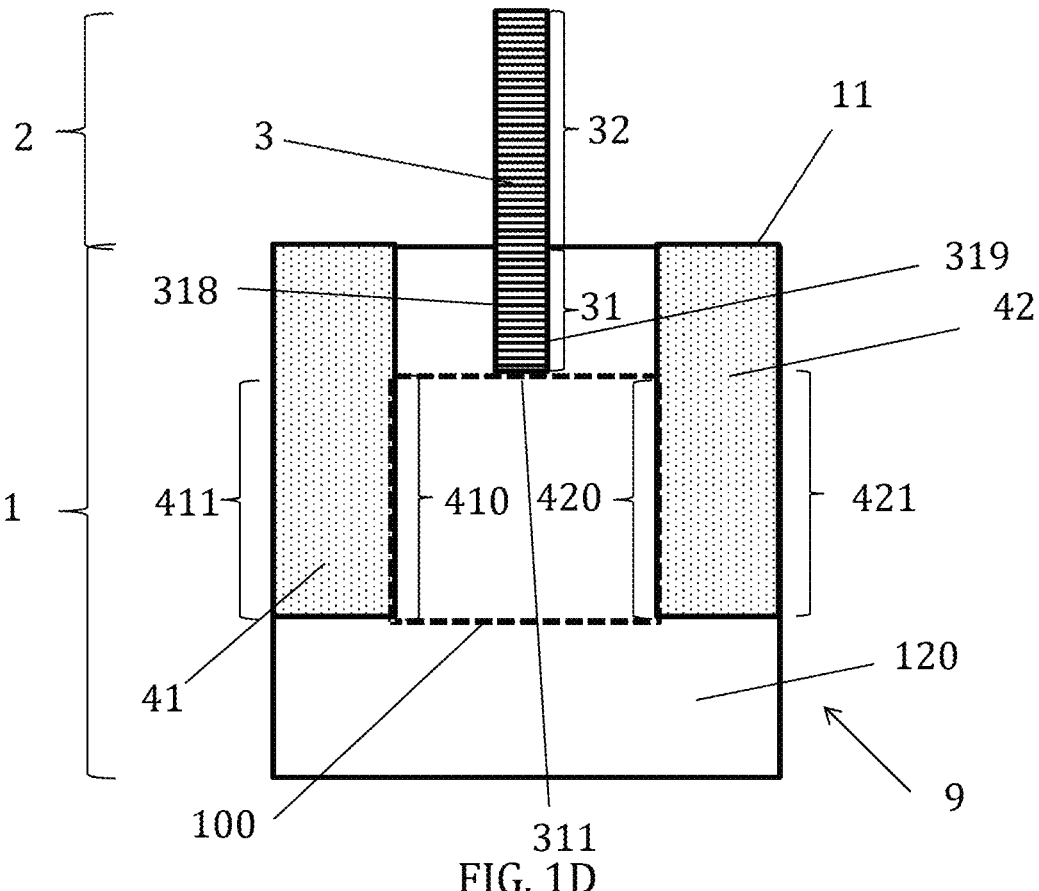

Example 1: Forming an Integrated Circuit Chip by Selectively Forming a Sacrificial Material in a Via Reference is made, simultaneously, to FIG. 1A, FIG. 1B FIG. 1C and FIG. 1D, that are schematic representations of an entity 9 comprising a semiconductor substrate 1 and a device layer 2 for use in a method in accordance with embodiments of the present disclosure, that may be obtained by providing 901 (see FIG. 18) the semiconductor substrate 1, and forming 902 (see FIG. 18) thereon a device layer 2 and providing shallow trench isolations 41, 42 in the semiconductor substrate 1, as will be described below. Herein, FIG. 1A is a top view, FIG. 1B is a vertical cross-section along dashed line A, that is a cut across the gate (to be formed), in FIG. 1A, and FIG. 1C is a vertical cross-section along dashed line B, that is a cut perpendicular to the gate, in FIG. 1A, and FIG. 1D is a vertical cross-section along dashed line C, that is a cut along the gate, that is, across the source or drain contact (to be formed), in FIG. 1A. The entity 9 comprises, on the semiconductor substrate 1, in the device layer 2, a nanosheet structure 23 for a first transistor structure and a nanosheet structure 24 for a second transistor structure.

The nanosheet structures 23 and 24 may comprise layers of silicon alternating with layers of silicon and germanium. In particular, in this example, the nanosheet structures 23, 24 comprise a nanosheet stack comprising alternating layers of Si and of SiGe. Herein, the nanosheet structures 23, 24 may be formed by patterning a stack of layers comprising alternating layers of Si and of SiGe, as is well-known to the skilled person.

The semiconductor substrate 1 are further provided with a first shallow trench isolation 41 and a second shallow trench isolation 42, extending from the frontside surface 11 of the semiconductor substrate 1, and which are embedded in the semiconductor substrate material 120. These are typically formed after the patterning of the stack of layers to form the nanosheet structures 23, 24. For example, shallow trenches may be formed in the semiconductor substrate, which may subsequently be filled with a dielectric material, using any technique known to the skilled person.

A trench is typically formed during the patterning of the stack of layers between the nanosheet structures 23, 24. Said trench may extend into the semiconductor substrate 1. Alternatively, the forming of the shallow trenches for the first 41 and second shallow trench isolation 42 may, simultaneously, extend the trench between the nanosheet structures 23, 24 into the semiconductor substrate 1. Herein, the part of the trench between the nanosheet structures 23, 24 in the semiconductor substrate 1 may be filled with the dielectric material deposited when forming the first 41 and second shallow trench isolation 42, and thereby form the part of the dielectric wall 3 in the semiconductor substrate 1. The dielectric wall 3, possibly only the part of the dielectric wall in the device layer 2, is typically formed after forming the shallow trench isolation 41, 42, by depositing a dielectric material in the trench. The nanosheet structure 23 for the first transistor structure and the nanosheet structure 24 for the second transistor structure are horizontally separated from each other by the dielectric wall 3, more particularly, by a device layer part 32 of the dielectric wall 3, that is the part 32 of the dielectric wall 3 in the device layer 2.

A substrate part 31 of the dielectric wall 3 extends, from a frontside surface 11 of the semiconductor substrate 1, vertically into the semiconductor substrate 1 and is embedded in a semiconductor substrate material 120, such as silicon. Herein, a single dielectric wall 3 may separate a plurality of first and second nanosheet structures for a plurality of forksheet devices from each other.

The shallow trench isolation structures 41 and 42 extend deeper into the semiconductor substrate 1 than the dielectric wall 3. Herein, an extending part 411 of the first shallow trench isolation 41 and an extending part 421 of the second shallow trench isolation 42 are at a distance from the frontside surface 11 of the semiconductor substrate 1 that is larger than a distance of an end 311 of the dielectric wall 3 in the semiconductor substrate 1 from the frontside surface 11 of the semiconductor substrate 1. That is, the extending parts 411, 421 are the parts of the first 41 and second shallow trench isolation 42 that extend into the semiconductor substrate 1 below a height of the end 311 of the dielectric wall 3 in the semiconductor substrate 1. Herein, the extending part 411 of the first shallow trench isolation 41 comprises a first surface 410 facing a second surface 420 of the extending part 421 of the second shallow trench isolation 42. A region (indicated by the dashed box 100) between the first surface 410 and the second surface 420 comprises, and in this example is formed of, the semiconductor substrate material 120. Furthermore, a first of two largest opposing surfaces 318 of said substrate part 31 of the dielectric wall 3 faces the first shallow trench isolation 41, and a second of the two largest opposing surfaces 319 of said substrate part 31 of the dielectric wall 3, opposite to the first of the two largest opposing surfaces 318, faces the second shallow trench isolation 42.

Figures 2A, 2B, 2C:
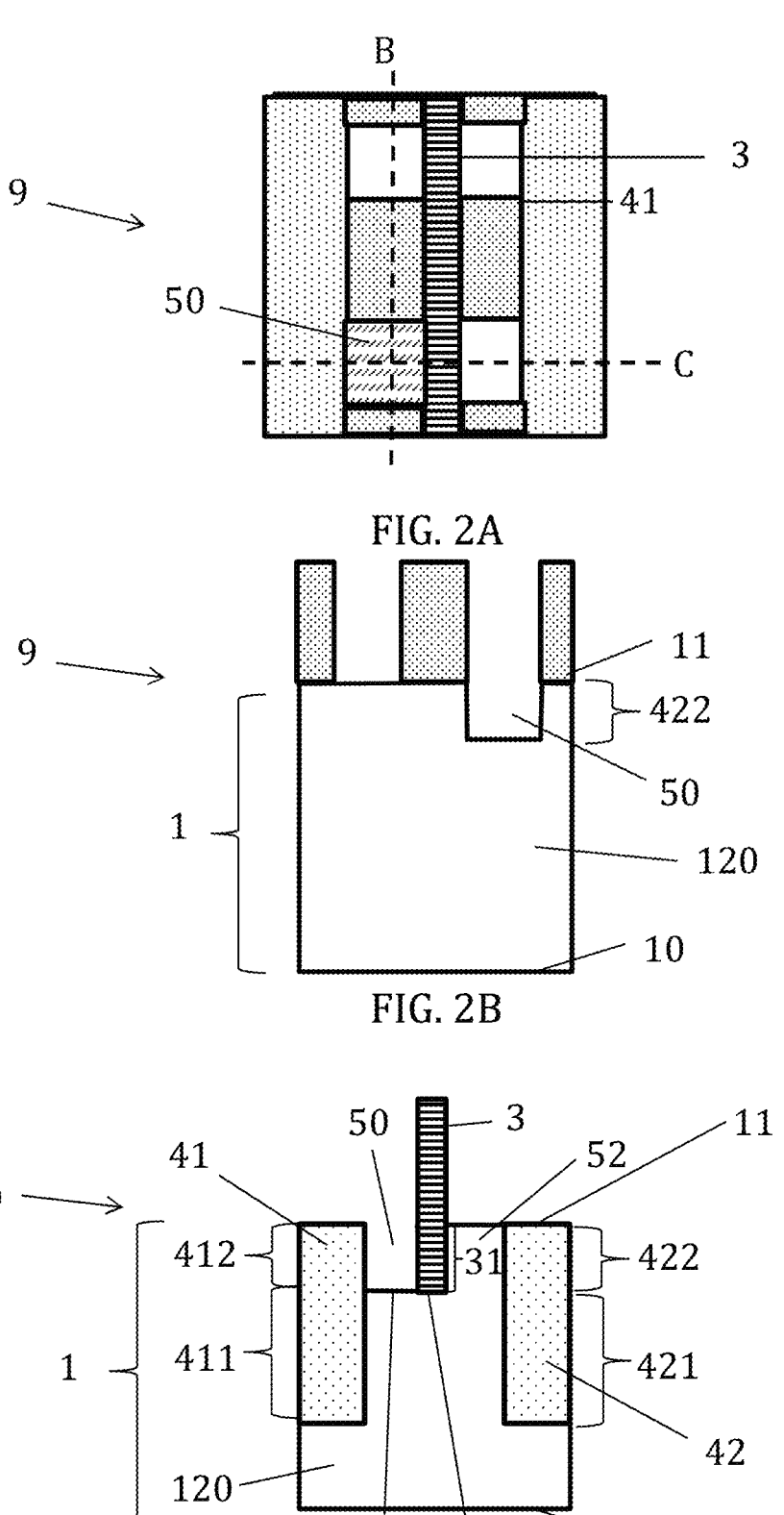

Reference is made, simultaneously, to FIG. 2A, FIG. 2B and FIG. 2C, that are schematic representations of the entity 9 for use in a method in accordance with embodiments of the present disclosure. Herein, FIG. 2A is a top view, FIG. 2B is a vertical cross-section along dashed line B, that is a cut perpendicular to the gate, in FIG. 2A, and FIG. 2C is a vertical cross-section along dashed line C, that is a cut along the gate, that is, across the source or drain contact, in FIG. 2A. In this example, a recess 50, for forming a via, is formed in the semiconductor substrate 1, selectively, between the first shallow trench isolation 41 and the dielectric wall 3, i.e., between a frontside part 412 of the first shallow trench isolation 41, corresponding to the part of the first shallow trench isolation 41 above the extending part 411 of the first shallow trench isolation 41, and the substrate part 31 of the dielectric wall 3. The recess 50 may, for example, be formed by a lithographic patterning technique. Forming the recess 50 for forming a via may result in a good alignment between the via, that will eventually be filled with an electrically conductive material, and a source or drain contact, that will be formed on the via material that will in a next step be deposited in the recess 50. At the same time, in this example, no recess is formed between the dielectric wall 3 and the second shallow trench isolation 42, so that the substrate part 31 of the dielectric wall 3 is horizontally (i.e., in a direction parallel to the frontside surface 11 of the semiconductor substrate 1) separated from (an upper part 422 of) the second shallow trench isolation 42, corresponding to the part of the second shallow trench isolation 42 above the extending part 421 of the second shallow trench isolation 42, by a further material 52 that is, in this example, the same material as the semiconductor substrate material 120.

Typically, the recess 50 does not extend deeper into the semiconductor substrate 1 than the end 311 of the dielectric wall 3 in the semiconductor substrate 1. In other words: typically, a vertical (i.e., in a direction from a backside surface 10 of the semiconductor substrate 1, opposite to the frontside surface 11 of the semiconductor substrate 1) distance between the end 311 of the dielectric wall 3 in the semiconductor substrate 1 and the frontside surface 11 of the semiconductor substrate 1 is equal to or larger than, usually equal to, a vertical distance between the bottom surface 500 of the recess 50 and the frontside surface 11 of the semiconductor substrate 1. Typically, the end 311 of the dielectric wall 3 in the semiconductor substrate 1 remains covered by the semiconductor substrate material 120. In this example, the recess 50 forms part of the via located in the semiconductor substrate 1.

Figure 3A:
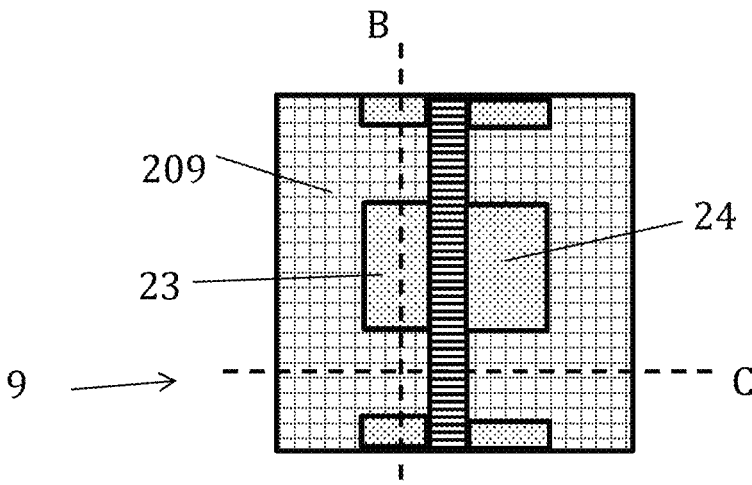
Figure 3B:
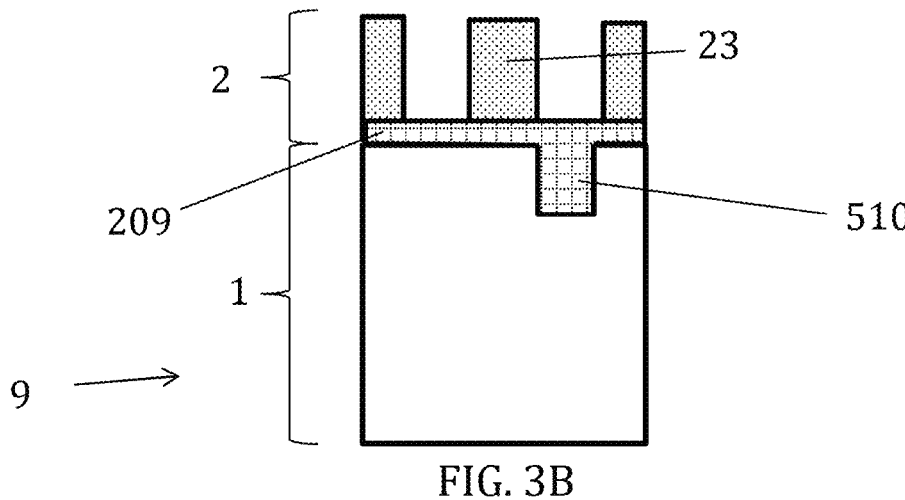
Figure 3C:
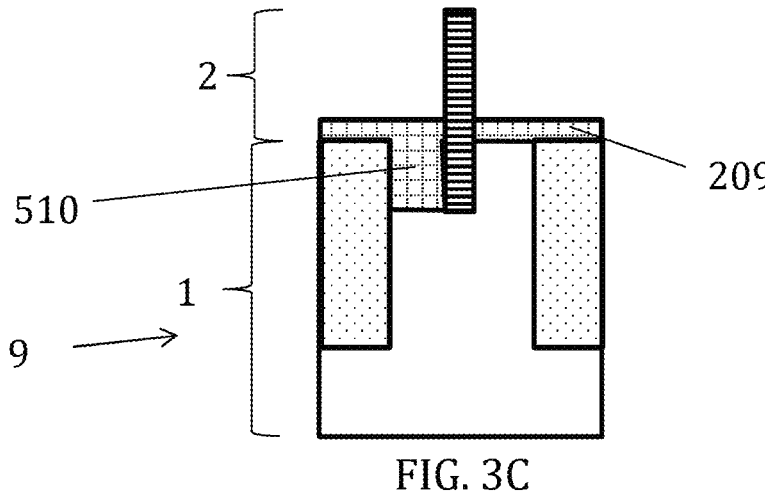

Reference is made, simultaneously, to FIG. 3A, FIG. 3B and FIG. 3C, that are schematic representations of an entity 9 for use in a method in accordance with embodiments of the present disclosure. Herein, FIG. 3A is a top view, FIG. 3B is a vertical cross-section along dashed line B, that is a cut perpendicular to the gate, in FIG. 3A, and FIG. 3C is a vertical cross-section along dashed line C, that is a cut along the gate, that is, across the source or drain contact, in FIG. 3A. In this example, a bottom dielectric isolation layer 209 is formed in the device layer 2 by first removing a bottom part of the nanosheet structures 23, 24, in particular, by removing a bottom layer formed of SiGe, that may have a different concentration of Ge than the other layers in the stack so as to allow selective removal of the bottom layer, from the stack of the nanosheet structures 23, 24, as is well-known to the skilled person. Subsequently, in this example, a via material 510, that is, in this example, a sacrificial dielectric material, is deposited to fill the recess 50 to form part of the via, and to overfill the recess 50 so that the overfill fills the gaps, formed by said removal of the bottom part of the nanosheet structures 23, 24, between the nanosheet structures 23, 24 and the semiconductor substrate 1. In one example, depositing the sacrificial material may, for example, comprise depositing a liner (e.g., SiN) covering surfaces of the recess 50 and possibly of the gaps, and subsequently depositing $SiO_2$ covering the liner and filling the recess 50 and the gaps between the nanosheet structures 23, 24 and the semiconductor substrate 1. The dielectric material in the gaps forms the bottom dielectric isolation layer 209, that may electrically insulate the nanosheet structures 23, 24 from the semiconductor substrate 1 and prevent sub-channel leakage between the nanosheet structures 23, 24, that are to form the channels for the transistor structures, and the semiconductor substrate 1. Said deposition of the dielectric material may be performed using any deposition technique as known to the person skilled in the art, such as using atomic layer deposition, e.g., using plasma enhanced atomic layer deposition, followed by an etch back.

Figure 4A:
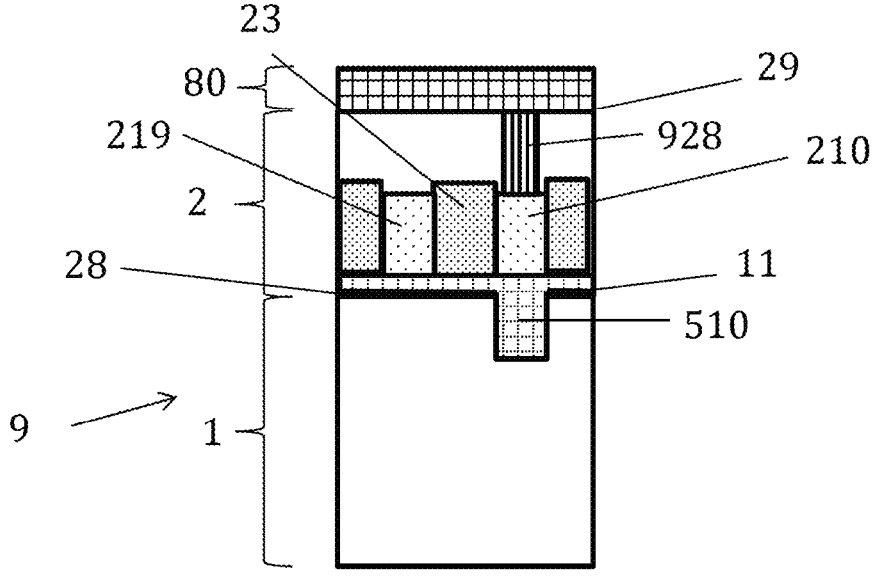
FIG. 4A and FIG. 4B are schematic representations of a vertical cross-section, perpendicular to the gate and along the gate, respectively, of an entity, after finalizing the frontside processing, for use in a method in accordance with embodiments of the present disclosure.
Figure 4B:
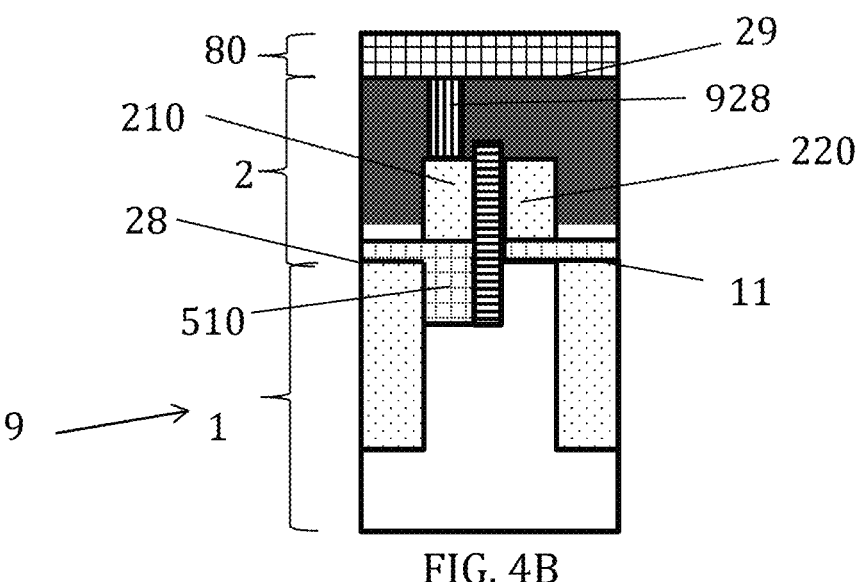

Reference is made, simultaneously, to FIG. 4A and FIG. 4B, corresponding, respectively, to a cut perpendicular to the gate and a cut along the gate and across the source or drain contacts 210, 220, after further processing steps to finish the frontside processing. The further processing steps comprise, in this example, formation of a source or drain contact 210 for the first transistor structure on the via material 510 in the via 51. Herein, the source or drain contact 210 may be formed by epitaxial growth, e.g., from the layers formed of silicon in the nanosheet structures 23. By the epitaxial growth, also further source or drain contacts may be formed, which, in this example, include a source or drain contact 220 for the second transistor structure and a further source or drain contact 219, on a side of the nanosheet structures 23 for the first transistor structure opposite the side where the source or drain contact 210 for the first transistor structure is formed.

The further processing steps may further comprise selectively removing the layers formed of SiGe of the nanosheet structures 23, 24, and, subsequently, a replacement gate process, wherein a gate dielectric and gate metal are deposited.

The first transistor structure comprises, in this example, the nanosheet structure 23, a gate dielectric, the source or drain contact 210, a gate metal, and the further source or drain contact 219. The second transistor structure contains, in this example, the nanosheet structure 24, a dielectric gate (see FIG. 3A), the source or drain contact 220, a gate metal, and a further source or drain contact (not shown) on the opposite side of the nanosheet structure 24 as the source or drain contact 220. The forksheet device comprises, in this example, the first transistor structure and the second transistor structure.

The further processing steps may further comprise deposition of and ILD, and forming any interconnects 928 in the device layer 2 for connecting any source of drain contacts 210 of any transistor structures to a frontside interconnect layer 80, thereby forming the device layer 2, using techniques that are well known to the skilled person. Furthermore, typically, the frontside interconnect layer 80 is formed on the frontside surface 29 of the device layer 2, opposite from a backside surface 28 of the device layer 2 contacting a frontside surface 11 of the semiconductor substrate 1.

In this example, the formation of the frontside interconnect layer 80 terminates the processing from the frontside surface 11 of the semiconductor substrate 1, comprising forming the device layer 2 and the frontside interconnect layer 80 on the frontside surface 11 of the semiconductor substrate 1. In this example, the processing is continued from the backside surface 10, which involves flipping of the front-processed entity 9 and bonding the entity 7, i.e., the frontside interconnect layer 80, to a carrier wafer for providing mechanical support. Any suitable industry standard bonding technique may be used for this purpose. Said flipping may, for example, be performed using a dedicated wafer flipping module, or may be performed manually.

Figure 5:
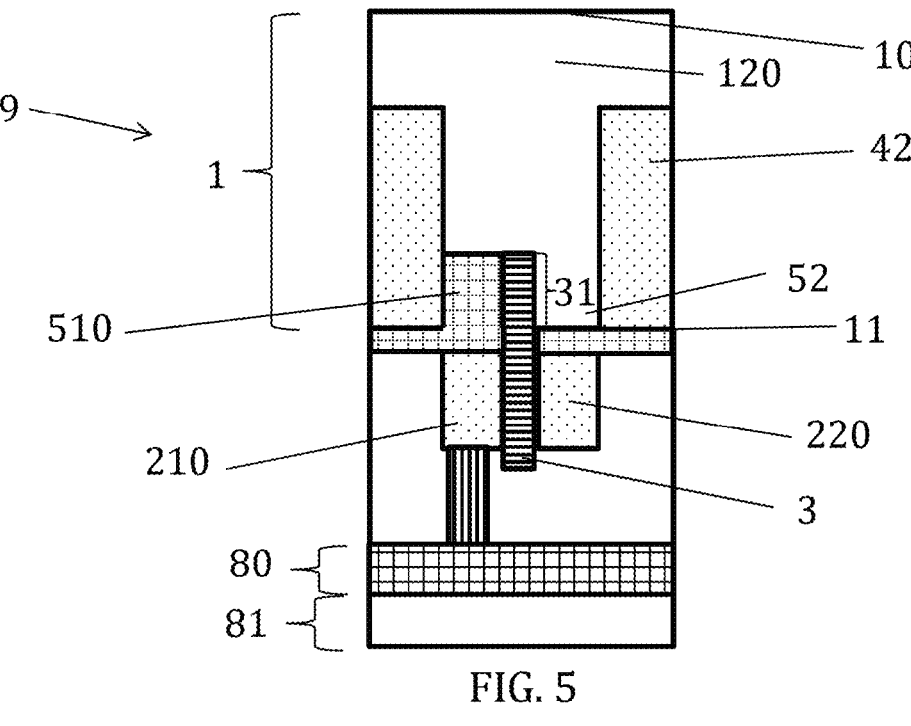
FIG. 5 is a schematic representation of a vertical cross-section, along the gate, of the entity, after flipping and bonding, for use in a method in accordance with embodiments of the present disclosure.

Reference is made to FIG. 5, which corresponds to FIG. 4B, that is a cut along the gate and across the source or drain contacts 210, 220, after flipping of the entity 9, and bonding of the frontside interconnect layer 80 to a carrier wafer 800. Flipping of the entity 9 may facilitate the subsequent steps that are performed from the backside surface 10 of the semiconductor substrate 1.

Herein, firstly, by removing 903 (see FIG. 18), by etching, from the backside surface 10 of the semiconductor substrate 1, in this example, at least part of the semiconductor substrate material 120 is removed, without removing the via material 510 and without removing the further material 52 separating the substrate part 31 of the dielectric wall 3 from the second shallow trench isolation 42. This etch may be selective so as not to etch via material 510 and the material of which the dielectric wall 3 is formed. However, as a timed etch is, in this example, performed to not remove the further material 52, that is, in this example, the same material as the semiconductor substrate material 120, is not essential.

Figure 6:
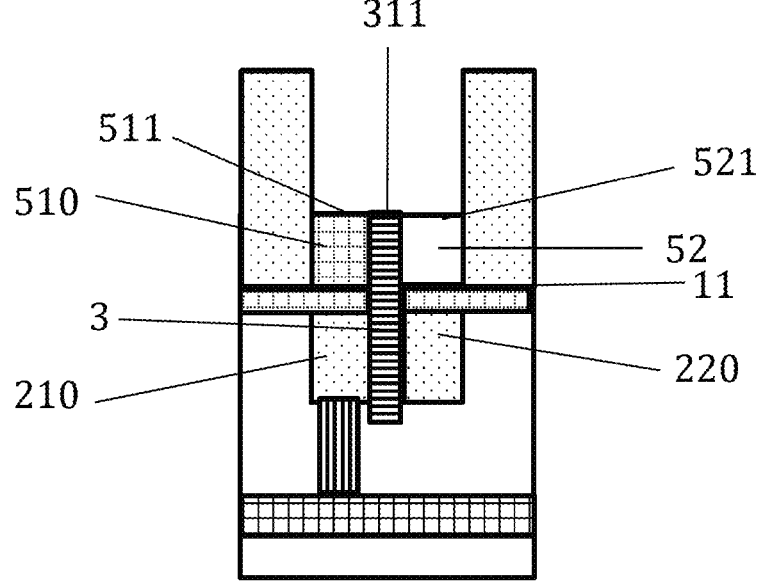
FIG. 6 is a schematic representation of a vertical cross-section, along the gate, of the entity, after removing the semiconductor substrate material, for use in a method in accordance with embodiments of the present disclosure.

The results in the structure are shown in FIG. 6, that is a cut along the gate and across the source or drain contacts 210, 220. As, in this example, the further material 52 is the same material as the semiconductor substrate material 120, the etch is terminated when a surface 521 of the further material 52, i.e., of the semiconductor substrate material 120 (see FIG. 5), facing away from the frontside surface 11 of the semiconductor substrate 1, is substantially coplanar with the end 311 of the dielectric wall 3 in the semiconductor substrate 1, and substantially coplanar with the surface 511 of the via material 510, facing away from the frontside surface 11 of the semiconductor substrate 1.

Reference is made to FIG. 7, that is a cut along the gate and across the source or drain contacts 210, 220. Subsequently, spacers are formed 904 (see FIG. 18) by forming a liner 6, comprising a conformal layer of a dielectric material, covering a backside surface 10 of the semiconductor substrate 1, opposite to the frontside surface 11 of the semiconductor substrate 1. The liner 6 may be deposited using any technique known to the ordinary skilled person, e.g., using atomic layer deposition. In this example, the thickness of the deposited liner 6 is substantially the same as the horizontal distance (i.e., in a direction parallel to the frontside surface 11 of the semiconductor substrate 1) separating the dielectric wall 3 from the first shallow trench isolation 41. In this example, the horizontal distance separating the dielectric wall 3 from the first shallow trench isolation 41 is substantially the same as the distance separating the dielectric wall 3 from the second shallow trench isolation 42. Thereby, a gap 634 separates a part of the liner 6 covering the first surface 410 of the first shallow trench isolation 41 from a part of the liner 6 covering the second surface 420 of the second shallow trench isolation 42. Herein, the gap 634, in a direction from the first surface 410 to the second surface 420, usually has a width substantially equal to the width in said direction of the dielectric wall 3.

Reference is made to FIG. 8, that is a cut along the gate and across the source or drain contacts 210, 220. After anisotropic etching of the liner, spacers 61, 62 are formed 904 (see FIG. 18). The anisotropic etch may be performed using any technique known to the skilled person, such as a plasma etch. The spacers 61, 62 comprise a first spacer 61 covering the first surface 410, wherein a surface 611 of the first spacer 61, facing the frontside surface 11 of the semiconductor substrate 1, covers, i.e., overlaps with, the end 511, e.g., bottom surface, of the via material 510 in the via, facing away from the frontside surface 11 of the semiconductor substrate 1. The spacers 61, 62 comprise a second spacer 62 covering the second surface 420, wherein a surface 621 of the second spacer 62, facing the frontside surface 11 of the semiconductor substrate 1, covers, i.e., overlaps with, the further material 52, i.e., a bottom surface 521 of the further material 52. The first spacer 61 and the second spacer 62 define a trench 122, wherein the end 311 of the dielectric wall 3 in the semiconductor substrate 1 is exposed to the trench 122.

Reference is made to FIG. 9, that is a cut along the gate and across the source or drain contacts 210, 220. An electrically insulating material is deposited 905 (see FIG. 18) in the trench, contacting the end 311 of the dielectric wall 3 in the semiconductor substrate 1. This may be followed by an etch-back to remove the electrically insulating material deposited elsewhere than in the trench. The electrically insulating material in the trench forms an extension 7 to the dielectric wall 3. Herein, a first end 71 of the extension 7, opposite to a second end 70 of the extension 7 contacting the dielectric wall 3, is recessed with respect to the first 41 and second shallow trench isolation 42. In other words, a vertical distance between the frontside surface 11 of the semiconductor substrate 1 and the first end 71 of the extension 7 is smaller than a vertical distance between the frontside surface 11 of the semiconductor substrate 1 and the surface 419, 429 of the first 41 and second shallow trench isolation 42, facing away from the frontside surface 11 of the semiconductor substrate 1.

In this example, the deposition and etch back is performed such that a width of the first end 71 of the extension 7, in a direction from the first shallow trench isolation 410 to the second shallow trench isolation 420, is substantially the same as, e.g. within 50%, or within 20%, of, the width of the end 311 of the dielectric wall 3 in the semiconductor substrate 1.

Reference is made to FIG. 10, that is a cut along the gate and across the source or drain contacts 210, 220. Subsequently, the spacers are removed 906 (see FIG. 18), forming a gap 81 between the first surface 410 and the extension 7, and a gap 82 between the second surface 420 and the extension 7. Said removal is, in this example, performed by selectively etching the liner with respect to the extension 7, the first shallow trench isolation 41, the second shallow trench isolation 42, the further material 52, i.e., the semiconductor substrate material, and the via material 510 in the via. This may be performed using any technique known to the ordinary skilled person.

Reference is made to FIG. 11, that is a cut along the gate and across the source or drain contacts 210, 220. The sacrificial material 510 in the via 51 is subsequently removed 907 (see FIG. 18) by etching, so as to expose the source of drain contact 210 of the first transistor structure, but without removing the bottom dielectric isolation layer 209. For example, the etch may be terminated once the source of drain contact 210 of the first transistor structure is exposed. The etching is, in this example, performed selectively with respect to the further material 52, so that the source or drain contact 220 of the second transistor structure is not exposed.

Reference is made to FIG. 12, that is a cut along the gate and across the source or drain contacts 210, 220. An electrically conductive material 812 is deposited 908 (see FIG. 18) in the via 51, electrically coupled to the source or drain contact 210 of the first transistor structure. The electrically conductive material 812 is further deposited in the gaps 81, 82. For depositing the electrically conductive material 812, any technique known to the ordinary skilled person may be used, such as electrodeposition or chemical vapor deposition. In this example, the deposited electrically conductive material 812 also covers the first end 71 of the extension 7, and the surfaces 419, 429 of the first 41 and second shallow trench isolation 42 facing away from the frontside surface 11 of the semiconductor substrate 1.

Reference is made to FIG. 13, that is a cut along the gate and across the source or drain contacts 210, 220. In this example, grinding, chemical mechanical polishing and/or an etch-back, usually chemical mechanical polishing, is performed so that the surface 419, 429 of the first 41 and second shallow trench isolation 42 facing away from the frontside surface 11 of the semiconductor substrate 1, the first end 71 of the extension 7, and a backside surface 8129 of the electrically conductive material, facing away from the frontside surface 11 of the semiconductor substrate 1, are coplanar. Thereby, a first buried power rail 810 is formed electrically coupled to the electrically conductive material 812 in the via 51, and a second buried power rail 820 is formed, separated, e.g., electrically isolated, from the first buried power rail 810 by the extension 7.

Now that the buried power rails 810, 820 have been formed in the semiconductor substrate 1, the entity 9 may be considered to be an integrated circuit chip, or alternatively, an intermediate in the formation of an integrated circuit chip. For example, the entity 9 may be further processed, comprising forming an electrically insulating layer covering the buried power rails 810, 820, and/or the entity 9 may be packaged.

Example 2: Forming an Integrated Circuit Chip by Selectively Removing a Sacrificial Material In the above Example 1, before depositing the sacrificial material, a recess 50, for forming a via, is formed in the semiconductor substrate 1 between the first shallow trench isolation 41 and the dielectric wall 3. See FIG. 2A, FIG. 2B, and FIG. 2C. For this, lithography may be performed on the frontside surface 11 of the semiconductor substrate 1, i.e., during frontside processing.

In an alternative approach, the semiconductor substrate material is recessed non-selectively, i.e., without applying the mask, during frontside processing, after which the sacrificial material may be deposited in each of the formed recesses.

Reference is made to FIG. 14, that is a cut along the gate and across the source or drain contacts 210, 220. As a result, the sacrificial material is not only present in the part of the via 51 between the first shallow trench isolation 41 and the dielectric wall 3, but also between the second shallow trench isolation 42 and the dielectric wall 3. As a result, in this example, not only the via material 510, but also the further material 52 is formed of the sacrificial material. Herein, FIG. 14 corresponds to the situation after formation of the extension 7 and after removal of the spacers, similar as in FIG. 10 of Example 1, but wherein, now in Example 2, the further material 52 is formed, instead, of the sacrificial material 510.

In still an alternative example, different from this Example 2, no recesses are formed, so that both the via material 510 and the further material 52 are formed of the semiconductor substrate material. The following processing steps may also be applicable to such alternative example. However, it is a benefit of providing the sacrificial material during frontside processing, that a good alignment between the via 51 and the source or drain contact 210 may be achieved.

Reference is made to FIG. 15, that is a cut along the gate and across the source or drain contacts 210, 220. A patterned mask 99 is formed on a backside surface 10 of the semiconductor substrate 1, opposite to the frontside surface 11 of the semiconductor substrate 1. Herein, the mask material covers the further material 52, i.e., the sacrificial material, between the second shallow trench isolation 42 and the dielectric wall 3, while exposing the via material 510 in the via 51.

Reference is made to FIG. 16, that is a cut along the gate and across the source or drain contacts 210, 220. Subsequently, the sacrificial material in the via 51 may be selectively removed 907 (see FIG. 18) by etching, exposing the source or drain contact 210 of the first transistor structure.

Next, the patterned mask 99 may be removed, resulting in the structure in FIG. 17, that is a cut along the gate and across the source or drain contacts 210, 220.

Subsequently, an electrically conductive material may be deposited 908 (see FIG. 18), as already described in Example 1, to fill the via 51 and to form buried power rails.

It is to be understood that although various embodiments, specific constructions and configurations, as well as materials, have been discussed herein for devices according to the present disclosure, various changes or modifications in form and detail may be made without departing from the scope of this present disclosure. Steps may be added or deleted to methods described within the scope of the present disclosure.

The invention claimed is:

1. A method for forming an integrated circuit chip, the method comprising:
   a) providing a semiconductor substrate having a frontside surface and a backside surface opposite to the frontside surface;
   b) forming a device layer on the frontside surface of the semiconductor substrate, the device layer comprising:
   a first transistor structure and a second transistor structure of a forksheet device, and
   a device layer part of a dielectric wall of the forksheet device horizontally separating the first transistor structure from the second transistor structure, and
   wherein, in the semiconductor substrate, the following is provided:
   a substrate part of the dielectric wall of the forksheet device,
   a first shallow trench isolation and a second shallow trench isolation, extending from the frontside surface of the semiconductor substrate vertically into the semiconductor substrate,
   wherein a first of two largest opposing surfaces of said substrate part of the dielectric wall faces the first shallow trench isolation, and wherein a second of the two largest opposing surfaces of said substrate part of the dielectric wall, opposite to the first of the two largest opposing surfaces, faces the second shallow trench isolation, wherein each of the first and second shallow trench isolations comprises an extending part located farther, in a direction from the frontside surface to the backside surface of the semiconductor substrate, from the frontside surface of the semiconductor substrate than an end of the dielectric wall in the semiconductor substrate facing the backside surface of the semiconductor substrate, wherein the extending part of the first shallow trench isolation comprises a first surface facing a second surface of the extending part of the second shallow trench isolation, wherein a region between the first surface and the second surface comprises a semiconductor substrate material, wherein the substrate part of the dielectric wall is horizontally separated from the second shallow trench isolation by a further material, and wherein a via, filled with a via material, is provided, the via contacting a source or drain contact of the first transistor structure and extending into the semiconductor substrate between the first shallow trench isolation and the substrate part of the dielectric wall;

c) subsequently removing, from the backside surface of the semiconductor substrate, opposite to the frontside surface of the semiconductor substrate, at least part of the semiconductor substrate material, selectively with respect to the via material, filling the via, and the further material, so as to expose the end of the dielectric wall in the semiconductor substrate, the first surface, and the second surface, thereby forming a gap between the first surface and the second surface;

d) obtaining a first spacer covering the first surface, wherein a surface of the first spacer facing the frontside surface of the semiconductor substrate overlaps with an end of the via in the semiconductor substrate, and a second spacer covering the second surface, wherein a surface of the second spacer facing the frontside surface of the semiconductor substrate overlaps with the further material, so as to obtain a trench between the first spacer and the second spacer, wherein the end of the dielectric wall in the semiconductor substrate is exposed to the trench; and e) depositing an electrically insulating material in the trench, wherein the electrically insulating material contacts the end of the dielectric wall in the semiconductor substrate, thereby forming an extension to the dielectric wall.

2. The method of claim 1, further comprising, after step e):

f) removing the first spacer and the second spacer, thereby forming a gap between the first surface and the extension and a gap between the second surface and the extension;

g) removing the via material from the via so as to expose the source or drain contact of the first transistor structure; and h) providing an electrically conductive material:
in the via, electrically coupled to the source or drain contact,
in the gap between the first surface and the extension, thereby forming a first buried power rail electrically coupled to the electrically conductive material in the via, and in the gap between the second surface and the extension, thereby forming a second buried power rail, separated from the first buried power rail by the extension.

3. The method according to claim 1, wherein step b) comprises:

b1) forming, on the semiconductor substrate, a nanosheet structure for the first transistor structure and a nanosheet structure for the second transistor structure, horizontally separated from each other by a trench;

b2) forming a first shallow trench and a second shallow trench in the semiconductor substrate;

b3) depositing an electrically insulating material in the first and second shallow trenches, thereby forming the first shallow trench isolation and the second shallow trench isolation, respectively;

b4) forming the dielectric wall by filling the trench separating the nanosheet structure for the first transistor structure and the nanosheet structure for the second transistor structure with a dielectric material;

b5) forming a recess in the semiconductor substrate between the first shallow trench isolation and the dielectric wall, thereby forming at least part of the via;

b6) depositing the via material that is a sacrificial material so as to fill the at least part of the via; and b7) forming the source or drain contact in contact with the sacrificial material.

4. The method according to claim 3, wherein step b) comprises forming a bottom dielectric isolation, wherein said forming of the bottom dielectric isolation comprises removing a bottom part of the nanosheet structures so as to form a gap between the nanosheet structures and the semiconductor substrate, wherein, in step b6), the recess is overfilled with the sacrificial material so as to fill the gap between the nanosheet structures and the semiconductor substrate, thereby forming the bottom dielectric isolation.

5. The method according to claim 1, wherein, in step c), removing at least part of the semiconductor substrate material comprises exposing a surface of the via material, facing away from the frontside surface of the semiconductor substrate, that is coplanar with the end of the dielectric wall in the semiconductor substrate, and exposing the further material horizontally separating the dielectric wall from the second shallow trench isolation such that a surface of the further material, facing away from the frontside surface of the semiconductor substrate, is coplanar with the end of the dielectric wall in the semiconductor substrate, and wherein, in step d), the first spacer is obtained covering the via material and the second spacer is obtained covering the further material.

6. The method according to claim 1, wherein the further material and the via material are the same, and wherein step c) comprises removing the substrate material selectively with respect to the via material.

7. The method according to claim 2, wherein the further material is the same material as the via material, wherein step c) comprises removing the substrate material selectively with respect to the via material.

8. The method according to claim 7, wherein step g) of removing the via material from the via comprises:

g1) forming a patterned mask exposing the via material in the via, and g2) etching the exposed via material.

9. The method according to claim 1, wherein the further material is the same material as the semiconductor substrate material, wherein the via material is formed of a sacrificial material, and wherein step c) of removing at least part of the semiconductor substrate material is terminated when the further material horizontally separating the dielectric wall from the second shallow trench isolation is reached.

10. The method according to claim 9, wherein step g) of removing the via material from the via comprises etching the via material selectively with respect to the further material.

11. The method according to claim 1, wherein obtaining the first and second spacer of step d) comprises:

d1) depositing a dielectric liner covering a backside surface of the semiconductor substrate; and d2) anisotropically etching the deposited dielectric liner so as to form the first and second spacer.

12. The method according to claim 1, wherein a distance, in a horizontal direction, from the first shallow trench isolation to the dielectric wall is within 10% of a distance, in a horizontal direction, from the second shallow trench isolation to the dielectric wall.

13. The method according to claim 2, wherein step h) further comprises performing chemical mechanical polishing so as to co-planarize a backside surface of each of the first and second shallow trench isolation, the extension, and a backside surface of the first and second buried power rails.

\* \* \* \* \*